United States Patent
Nanao et al.

(10) Patent No.: US 7,309,450 B2
(45) Date of Patent: *Dec. 18, 2007

(54) PIEZOELECTRIC PORCELAIN AND METHOD FOR PREPARATION THEREOF

(75) Inventors: Masaru Nanao, Tokyo (JP); Yasuharu Miyauchi, Tokyo (JP); Tamotsu Ishiyama, Tokyo (JP); Masahito Furukawa, Tokyo (JP); Shogo Murosawa, Tokyo (JP); Yoshiko Gokita, Tokyo (JP)

(73) Assignee: TDK Corporation, Nihonbashi (JP)

( * ) Notice: Subject to any disclaimer, the term of this patent is extended or adjusted under 35 U.S.C. 154(b) by 724 days.

This patent is subject to a terminal disclaimer.

(21) Appl. No.: 10/479,576

(22) PCT Filed: Jun. 14, 2002

(86) PCT No.: PCT/JP02/05966

§ 371 (c)(1),
(2), (4) Date: Dec. 11, 2003

(87) PCT Pub. No.: WO02/102738

PCT Pub. Date: Dec. 27, 2002

(65) Prior Publication Data

US 2005/0006618 A1    Jan. 13, 2005

(30) Foreign Application Priority Data

Jun. 15, 2001 (JP) .............................. 2001-182423
Jan. 31, 2002 (JP) .............................. 2002-023411
Mar. 5, 2002 (JP) .............................. 2002-059091
Mar. 20, 2002 (JP) .............................. 2002-078577
Jun. 3, 2002 (JP) .............................. 2002-161115

(51) Int. Cl.
*H01L 41/187* (2006.01)
(52) U.S. Cl. ................. 252/62.9 R; 501/134; 501/135; 501/136
(58) Field of Classification Search ........... 252/62.9 R; 501/134, 135, 136
See application file for complete search history.

(56) References Cited

U.S. PATENT DOCUMENTS 3,640,865 A * 2/1972 Burns et al. ............ 252/62.9 R
5,037,784 A    8/1991 Raveau et al.

(Continued)

FOREIGN PATENT DOCUMENTS

JP          49-125900          12/1974

(Continued)

*Primary Examiner*—C. Melissa Koslow
(74) *Attorney, Agent, or Firm*—Oliff & Berridge, PLC

(57) ABSTRACT

Provided is a piezoelectric ceramic with a wider operating temperature range capable of obtaining a larger amount of displacement and being easily sintered, as well as being superior in terms of ultra-low emission, environmental friendliness and ecology. A piezoelectric substrate 1 comprises a composition including a perovskite-type oxide $(Na_{1-x-y-z}K_xLi_yAg_z)(Nb_{1-w}Ta_w)O_3$ and a tungsten bronze-type oxide $M(Nb_{1-v}Ta_v)_2O_6$ (M is an element of Group 2 in the long form of the periodic table of the elements). The values of x, y and z are preferably within a range of $0.1 \leq x \leq 0.9$, $0 \leq y \leq 0.2$, and $0 \leq z \leq 0.05$, respectively. The content of the tungsten bronze-type oxide is preferably 5.3 mol % or less. Thereby, a higher Curie temperature and a larger amount of displacement can be obtained, and sintering can be more easily carried out.

25 Claims, 3 Drawing Sheets

U.S. PATENT DOCUMENTS

| | | |
|---|---|---|
| 6,083,415 A | 7/2000 | Kimura et al. |
| 6,093,339 A | 7/2000 | Kimura et al. |

FOREIGN PATENT DOCUMENTS

| | | |
|---|---|---|
| JP | 51-120000 | 10/1976 |
| JP | 56-120180 | 9/1981 |
| JP | 02-159079 | 6/1990 |
| JP | 09-165262 | 6/1997 |
| JP | 10-231172 | 9/1998 |
| JP | A-11-228225 | 8/1999 |
| JP | A-11-228226 | 8/1999 |
| JP | A-11-228227 | 8/1999 |
| JP | A-11-228228 | 8/1999 |
| JP | 2000-313664 | 11/2000 |
| JP | 2001-114560 | 4/2001 |
| JP | A-2002-338351 | 11/2002 |
| JP | A-2002-338355 | 11/2002 |
| WO | WO 00/77832 A2 | 12/2000 |

* cited by examiner

PIEZOELECTRIC PORCELAIN AND METHOD FOR PREPARATION THEREOF

TECHNICAL FIELD

The present invention relates to a piezoelectric ceramic comprising a composition including a perovskite-type oxide and a tungsten bronze-type oxide, more specifically to a piezoelectric ceramic suitable for vibration devices such as actuators or the like, sound components, sensors and so on.

BACKGROUND ART

An actuator using a piezoelectric ceramic uses such a piezoelectric effect that when an electric field is applied, mechanical strain and stress will be generated. The actuator has such characteristics that a very small displacement can be obtained with high accuracy, and generated strain is large, and, for example, the actuator is used to position a precision tool or an optical device. As a conventional piezoelectric ceramic used for the actuator, lead zirconate titanate (PZT) having excellent piezoelectric properties is used most often. However, lead zirconate titanate contains a large amount of lead, so adverse effects on global environment such as lead leaching due to acid rain have become controversial. Therefore, the development of piezoelectric ceramics not including lead instead of lead zirconate titanate is desired.

As the piezoelectric ceramic not including lead, for example, a piezoelectric ceramic including barium titanate ($BaTiO_3$) as a main component is known (refer to Japanese Unexamined Patent Application Publication No. Hei 2-159079). The piezoelectric ceramic is superior in a high relative dielectric constant $\in r$ and a high electromechanical coupling factor kr, so the piezoelectric ceramic holds promise as a piezoelectric material for the actuator. Moreover, as another piezoelectric ceramic not including lead, for example, a piezoelectric ceramic including potassium sodium lithium niobate as a main component is known (refer to Japanese Unexamined Patent Application Publication No. Sho 49-125900 or Japanese Examined Patent Application Publication No. Sho 57-6713). The piezoelectric ceramic has a high Curie temperature of 350° C. or over, and an excellent electromechanical coupling factor kr, so the piezoelectric ceramic holds promise as a piezoelectric material. Further, a compound including potassium sodium niobate and a tungsten bronze-type oxide has been recently reported (Japanese Unexamined Patent Application Publication No. Hei 9-165262).

However, the piezoelectric ceramics not including lead have such a problem that they have lower piezoelectric properties, compared to lead-based piezoelectric ceramics, so a sufficiently large amount of generated displacement cannot be obtained. Moreover, in the piezoelectric ceramic including barium titanate as a main component, barium titanate has a low Curie temperature of approximately 120° C., so there is such a problem that an operating temperature range is limited to 100° C. or less. Further, in the piezoelectric ceramic including sodium lithium potassium niobate as a main component, sodium, potassium and lithium are easily volatilized during sintering, so there is such a problem that it is difficult to sinter the piezoelectric ceramic.

In view of the foregoing, it is an object of the invention to provide a piezoelectric ceramic with a wider operating temperature range capable of obtaining a large amount of generated displacement, and capable of being easily sintered, and being superior in the point of ultra-low emission, environmental friendliness and ecology.

DISCLOSURE OF THE INVENTION

A first piezoelectric ceramic according to the invention comprises a composition including a perovskite-type oxide and a tungsten bronze-type oxide, wherein the perovskite-type oxide includes a first element including sodium (Na), potassium (K) and lithium (Li), a second element including niobium (Nb) or a second element including niobium and tantalum (Ta), and oxygen (O).

In the first piezoelectric ceramic according to the invention, the perovskite-type oxide and the tungsten bronze-type oxide are comprised, and the perovskite-type oxide includes sodium, potassium and lithium, so a higher Curie temperature, and higher values of a electromechanical coupling factor kr, a relative dielectric constant $\in r$ and an amount of generated displacement can be obtained, and sintering can be easily carried out.

Moreover, in the perovskite-type oxide, as the first element, silver (Ag) may be further included. In this case, the content of silver in the first element is preferably within a range of 5 mol % or less.

A second piezoelectric ceramic according to the invention comprises a composition including a first perovskite-type oxide, a second perovskite-type oxide and a tungsten bronze-type oxide, wherein the first perovskite-type oxide includes a first element including sodium and potassium, a second element including niobium or a second element including niobium and tantalum, and oxygen, the second perovskite-type oxide includes an element of Group 2 in the long form of the periodic table of the elements and titanium (Ti), and the content of the second perovskite-type oxide in the composition is less than 10 mol %.

In the second piezoelectric ceramic according to the invention, the second perovskite-type oxide is comprised in addition to the first perovskite-type oxide and the tungsten bronze-type oxide, so the Curie temperature can be increased, and sintering can be easily carried out, and a larger amount of generated displacement can be obtained.

Moreover, the first perovskite-type oxide may further include lithium as the first element.

Moreover, in the first and the second piezoelectric ceramics, the content of potassium in the first element is preferably within a range of 10 mol % to 90 mol % both inclusive, and the content of lithium in the first element is preferably 20 mol % or less. A composition ratio of the first element to the second element (the first element/the second element) is preferably within a range of 0.95 to 1.05 both inclusive at molar ratio.

Moreover, the content of the tungsten bronze-type oxide in the composition is preferably 5.3 mol % or less. The tungsten bronze-type oxide preferably includes a third element including at least one kind selected from elements of Group 2 in the long form of the periodic table of the elements, a fourth element including niobium or a fourth element including niobium and tantalum, and oxygen. The third element preferably includes at least one kind selected from the group consisting of magnesium (Mg), calcium (Ca), strontium (Sr) and barium (Ba).

In addition, the total content of tantalum in the second element and the fourth element is preferably within a range of 0 mol % to 50 mol % both inclusive.

Moreover, it is preferable that the composition is considered as a main component, and as a sub-component, an oxide including at least one kind selected from the group consisting of elements of Groups 4 through 11 in the long form of the periodic table of the elements, elements of Group 3 in the long form of the periodic table of the elements and elements of Group 12 in the long form of the periodic table of the elements is included within a range of 0.01 wt % to 1 wt % both inclusive relative to the main component in total by each element group. Among them, an oxide including manganese (Mn) is preferably included, and more preferably an oxide including at least one kind selected from the group consisting of iron (Fe), cobalt (Co), nickel (Ni) and zinc (Zn) is included in addition to manganese.

In a method of manufacturing a piezoelectric ceramic according to the invention, the piezoelectric ceramic comprises a first perovskite-type oxide including a first element including sodium and potassium, a second element including niobium or a second element including niobium and tantalum, and oxygen, a second perovskite-type oxide including an element of Group 2 in the long form of the periodic table of the elements and titanium, and a tungsten bronze-type oxide, and the method comprises the step of calcining a mixture including elements of the first perovskite-type oxide, the second perovskite-type oxide and elements of the tungsten bronze-type oxide.

In the method of manufacturing a piezoelectric ceramic according to the invention, the second perovskite-type oxide is added to the mixture, so the piezoelectric ceramic comprising the first perovskite-type oxide, the second perovskite-type oxide and the tungsten bronze-type oxide can be easily obtained, and a higher Curie temperature and a larger amount of generated displacement can be obtained.

BEST MODE FOR CARRYING OUT THE INVENTION

Figure 1:
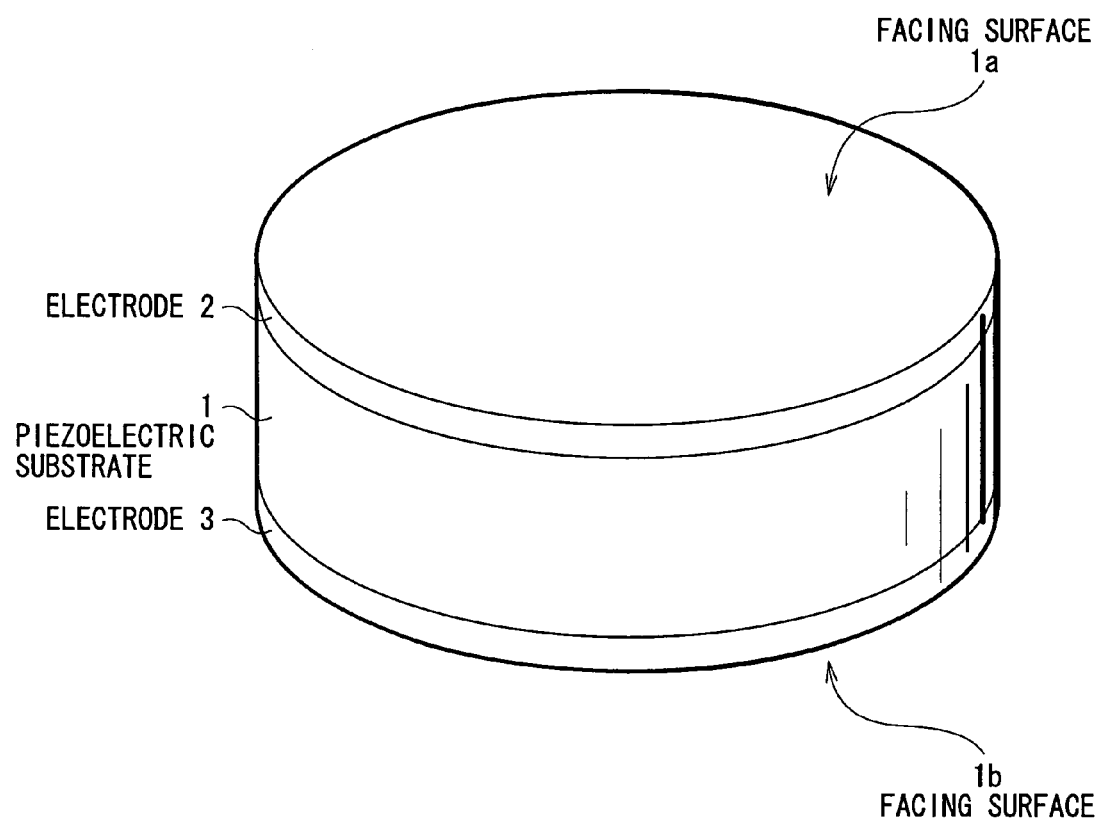
FIG. 1 is an illustration of a piezoelectric device using a piezoelectric ceramic according to a first embodiment of the invention.

Preferred embodiments of the present invention will be described in more detail below. The following formulas are used with reference to the exemplary embodiments described herein:

$(Na_{1-x-y-z}K_xLi_yAg_z)_p(Nb_{1-w}Ta_w)O_3$   CHEMICAL FORMULA 1

$M(Nb_{1-v}Ta_v)_2O_6$   CHEMICAL FORMULA 2

$(1-n)A+nB$   CHEMICAL FORMULA 3

$(Na_{1-x-y}K_xLi_yAg_z)_p(Nb_{1-w}Ta_w)O_3$   CHEMICAL FORMULA 4

$QTiO_3$   CHEMICAL FORMULA 5

$(1-m-n)A1+mA2+nB$   CHEMICAL FORMULA 6

$(1-n)\{(Na_{0.57}K_{0.38}Li_{0.05})NbO_3\}+n\{BaNb_2O_6\}$   CHEMICAL FORMULA 7

$(1-n)\{(Na_{0.95-x}K_xLi_{0.05})NbO_3\}+n\{BaNb_2O_6\}$   CHEMICAL FORMULA 8

$(1-n)\{(Na_{1-x-y}K_xLi_y)NbO_3\}+n\{BaNb_2O_6\}$   CHEMICAL FORMULA 9

$(1-n)\{(Na_{0.57}K_{0.38}Li_{0.05})(Nb_{1-w}Ta_w)O_3\}+n\{Ba(Nb_{1-x}Ta_v)_2O_6\}$   CHEMICAL FORMULA 10

$(1-n)\{(Na_{0.57}K_{0.38}Li_{0.05})_pNbO_3\}+n\{BaNb_2O_6\}$   CHEMICAL FORMULA 11

$(1-n)\{(Na_{0.57}K_{0.38}Li_{0.05})NbO_3\}+n\{MNb_2O_6\}$   CHEMICAL FORMULA 12

$0.995\{(Na_{0.57}K_{0.38}Li_{0.05})(Nb_{0.9}Ta_{0.1})O_3\}+0.005\{Ba(Nb_{0.9}Ta_{0.1})_2O_6\}$   CHEMICAL FORMULA 13

$(1-n)\{(Na_{0.95-x-z}K_xLi_{0.05}Ag_z)NbO_3\}+n\{BaNb_2O_6\}$   CHEMICAL FORMULA 14

$0.995\{(Na_{0.56}K_{0.38}Li_{0.05}Ag_{0.01})NbO_3\}+0.005\{BaNb_2O_6\}$   CHEMICAL FORMULA 15

$(0.995-m)(Na_{0.57}K_{0.38}Li_{0.05})NbO_3+MBaTiO_3+0.005BaNb_2O_6$   CHEMICAL FORMULA 16

$(0.995-m)(Na_{1-x-y}K_xLi_y)NbO_3+mBaTiO_3+0.005BaNb_2O_6$   CHEMICAL FORMULA 17

$(0.995-m)(Na_{0.57}K_{0.38}Li_{0.05})(Nb_{1-w}Ta_w)O_3+mBaTiO_3+0.005Ba(Nb_{1-v}Ta_v)_2O_6$   CHEMICAL FORMULA 18

$0.985(Na_{0.57}K_{0.38}Li_{0.05})NbO_3+0.01BaTiO_3+0.005BaNb_2O_6$   CHEMICAL FORMULA 19

FIRST EMBODIMENT

A piezoelectric ceramic according to a first embodiment of the invention comprises a composition including a perovskite-type oxide and a tungsten bronze-type oxide as a main component. In the composition, the perovskite-type oxide and the tungsten bronze-type oxide may form a solid solution, or may not perfectly form a solid solution.

The perovskite-type oxide includes a first element, a second element and oxygen. The first element includes sodium, potassium and lithium, and may further include silver. The second element includes niobium or a second element including niobium and tantalum, and preferably further includes tantalum, because in such a case, superior piezoelectric properties can be obtained with no lead or a smaller content of lead. Further, it is because the Curie temperature can be increased, thereby an operating temperature range can be extended. The perovskite-type oxide is represented by, for example, Chemical Formula 1.

In Chemical Formula 1, the values of x, y, z and w are within a range of $0<x<1$, $0<y<1$, $0 \leq z<1$ and $0 \leq w<1$, respectively. When the perovskite-type oxide is a stoichiometric composition, p is 1, but the perovskite-type oxide may deviate from the stoichiometric composition. The composition of oxygen is stoichiometrically determined, and it may deviate from the stoichiometric composition.

The content of potassium in the first element is preferably within a range of 10 mol % to 90 mol % inclusive. In other words, for example, the value of x in Chemical Formula 1 is preferably within a range of $0.1 \leq x \leq 0.9$ at molar ratio, because when the content of potassium is too small, a relative dielectric constant ∈r, an electromechanical coupling factor kr, and an amount of generated displacement cannot be sufficiently increased, and when the content of potassium is too large, potassium is vigorously volatilized during sintering, so it is difficult to sinter. The content of potassium is more preferably within a range of 20 mol % to 75 mol % inclusive, still more preferably within a range of 30 mol % to 60 mol % inclusive, still more preferably within a range of 33 mol % to 57 mol % inclusive, and still more preferably within a range of 38 mol % to 55 mol % inclusive. For example, the value of x in Chemical Formula 1 is more preferably within a range of $0.2 \leqq x \leqq 0.75$, still more preferably $0.3 \leqq x \leqq 0.6$, more preferably $0.33 \leqq x \leqq 0.57$ and still more preferably $0.38 \leqq x \leqq 0.55$.

The content of lithium in the first element is preferably within a range of 20 mol % or less. In other words, for example, the value of y in Chemical Formula 1 is preferably within a range of $0<y \leqq 0.2$ at molar ratio, because when the content of lithium is too large, the relative dielectric constant $\in r$, the electromechanical coupling factor kr and the amount of generated displacement cannot be sufficiently increased. The content of lithium is more preferably within a range of 2 mol % to 20 mol % inclusive, and still more preferably 5 mol % to 10 mol % inclusive. For example, the value of y in Chemical Formula 1 is more preferably within a range of $0.02 \leqq y \leqq 0.2$, and still more preferably within a range of $0.05 \leqq y \leqq 0.1$.

The content of silver in the first element is preferably within a range of 5 mol % or less. In other words, for example, the value of z in Chemical Formula 1 is preferably within a range of $0 \leqq z \leqq 0.05$ at molar ratio, because when the content of silver is too large, the relative dielectric constant $\in r$, the electromechanical coupling factor kr and the amount of generated displacement cannot be sufficiently increased.

A composition ratio of the first element to a second element (the first element/the second element), that is, for example, the value of p in Chemical Formula 1 is preferably within a range of 0.95 to 1.05 inclusive at molar ratio. It is because when it is less than 0.95, the relative dielectric constant $\in r$, the electromechanical coupling factor kr and the amount of generated displacement become smaller, and when it is larger than 1.05, it is difficult to carry out polarization due to a decline in sintering density.

The tungsten bronze-type oxide includes a third element, a fourth element and oxygen. The third element preferably includes, for example, at least one kind selected from elements of Group 2 in the long form of the periodic table of the elements, and more preferably includes at least one kind selected from the group consisting of magnesium, calcium, strontium and barium. The fourth element preferably includes, for example, niobium or a fourth element including niobium and tantalum, and more preferably further includes tantalum, because in such a case, superior piezoelectric properties can be obtained with no lead or a smaller content of lead. The tungsten bronze-type oxide is represented by, for example, Chemical Formula 2.

In Chemical Formula 2, M represents the third element, and the value of v is within a range of $0 \leqq v \leqq 1$. A composition ratio of the third element, the fourth element and oxygen is stoichiometrically determined, and it may deviate from the stoichiometric composition.

The fourth element may be the same as or different from the second element. The total content of tantalum in the second element and the fourth element is preferably within a range of 50 mol % or less. It is because when the total content of tantalum is too large, the Curie temperature is decreased to 150° C. or less, and the electromechanical coupling factor kr and the amount of generated displacement become smaller. The total content of tantalum is more preferably within a range of 3 mol % to 30 mol % inclusive, and still more preferably within a range of 6 mol % to 20 mol % inclusive.

A composition ratio of the perovskite-type oxide and the tungsten bronze-type oxide is preferably within a range shown in Chemical Formula 3 at molar ratio. More specifically, the content of the tungsten bronze-type oxide in the composition is preferably within a range of larger than 0 mol % and equal to 5.3 mol % or less, more preferably within a range of 0.2 mol % to 2.6 mol % inclusive, and still more preferably within a range of 0.5 mol % to 1.0 mol % inclusive. When the tungsten bronze-type oxide is included in addition to the perovskite-type oxide, sintering can be easily carried out, and the relative dielectric constant $\in r$, the electromechanical coupling factor kr and the amount of generated displacement can be increased. However, when the content of the tungsten bronze-type oxide is too large, the electromechanical coupling factor kr and the amount of generated displacement become smaller.

In Chemical Formula 3, A represents the perovskite-type oxide, B represents the tungsten bronze-type oxide, and the value of n is preferably within a range of $0<n \leqq 0.053$, more preferably within a range of $0.002 \leqq n \leqq 0.026$, and still more preferably within a range of $0.005 \leqq n \leqq 0.01$.

The piezoelectric ceramic preferably comprises an oxide including at least one kind selected from the group consisting of elements of Groups 4 through 11 in the long form of the periodic table of the elements, elements of Group 3 in the long form of the periodic table of the elements and elements of Group 12 in the long form of the periodic table of the elements as a sub-component in addition to the above composition which is a main component. It is because by improved sinterability, piezoelectric properties can be further improved.

Among them, an oxide including manganese is preferably included as the sub-component, because a higher effect can be obtained. Moreover, manganese oxide is considered as a first sub-component, and in addition to manganese oxide, an oxide including at least one kind selected from the group consisting of iron, cobalt, nickel and zinc are more preferably included as a second sub-component, because a higher effect can be obtained. The oxides as the sub-components may exist in a grain boundary of the composition of the main component, or may exist so as to be dispersed in a part of the composition of the main component.

The total content of the sub-component relative to the main component by each of oxides including elements of Groups 4 through 11 in the long form of the periodic table of the elements, oxides including elements of Group 3 in the long form of the periodic table of the elements, and oxides including elements of Group 12 in the long form of the periodic table of the elements is preferably within a range of 0.01 wt % to 1 wt % inclusive. In other words, when a plurality of elements are included as the sub-component, the total content of oxides by each element group is preferably within the above range. When the component of the sub-component is too large, original properties of the main component cannot be obtained, and the amount of generated displacement decreases. As an oxide for calculating the content of the sub-component, $MnO$, $Fe_2O_3$, $C_{o3}O_4$, $NiO$, $ZnO$ or the like in chemical formula is used as a reference.

In addition, the piezoelectric ceramic may include lead (Pb), but the component of lead is preferably within a range of 1 wt % or less, and more preferably, no lead is included. It is because the volatilization of lead during sintering, and the emission of lead into environment after the piezoelectric ceramic is distributed in a market as a piezoelectric part, and then is disposed can be minimized, and it is preferable in the point of ultra-low emission, environmental friendliness and ecology.

The piezoelectric ceramic is preferably used as, for example, a material of a vibration device such as an actuator or the like, a sound component, a sensor or the like which is a piezoelectric device.

FIG. 1 shows an example of a piezoelectric device using the piezoelectric ceramic according to the embodiment. The piezoelectric device comprises a piezoelectric substrate 1 made of the piezoelectric ceramic according to the embodiment, and a pair of electrodes 2 and 3 disposed on a pair of facing surfaces 1a and 1b of the piezoelectric substrate 1, respectively. The piezoelectric substrate 1 is polarized, for example, in a thickness direction, that is, a direction where the electrodes 2 and 3 face each other, and when a voltage is applied through the electrodes 2 and 3, vertical vibration in a thickness direction occurs, and then vibration propagates in a diameter direction.

The electrodes 2 and 3 are made of, for example, metal such as gold (Au) or the like, and are disposed on the whole facing surfaces 1a and 1b of the piezoelectric substrate 1, respectively. The electrodes 2 and 3 are electrically connected to an external power source (not shown) through a wire (not shown).

For example, the piezoelectric ceramic and the piezoelectric device having such a structure can be manufactured as follows.

At first, as materials of the main component, for example, oxide powders including sodium, potassium, lithium, silver, an element of Group 2 in the long form of the periodic table of the elements, niobium and tantalum are prepared as required. Further, as a material of the sub-component, for example, an oxide powder including at least one kind selected from the group consisting of elements of Groups 4 through 11 in the long form of the periodic table of the elements, elements of Group 3 in the long form of the periodic table of the elements and elements of Group 12 in the long form of the periodic table of the elements is prepared as required. As the materials of the main component and the sub-component, materials which become oxides through firing such as carbonate or oxalate may be used instead of the oxides. Next, after these materials are sufficiently dried, the materials are weighed so that the final composition is within the above-described range.

Then, after the weighed materials are mixed in an organic solvent or water by a ball mill or the like, the materials are dried, and are pressed, and then is calcined at 750° C. to 1100° C. for 1 to 4 hours. After calcining, for example, the calcined material is sufficiently pulverized by a ball mill or the like in an organic solvent or water, and is dried again, then a binder is added to the material to granulate the material. After granulating, the granulated powder is pressed by the use of a uniaxial press, a cold isostatic press (CIP) or the like.

After pressing, for example, the pressed body is heated to remove the binder, and then is further sintered at 950° C. to 1350° C. for 2 to 4 hours. After sintering, the obtained sintered body is processed as required to form the piezoelectric substrate 1, and then the electrodes 2 and 3 are disposed on the piezoelectric substrate 1. Then, an electric field is applied to the piezoelectric substrate 1 in heated silicon oil to carry out polarization. Thereby, the above-described piezoelectric ceramic and the piezoelectric device shown in FIG. 1 can be obtained.

Thus, in the embodiment, the perovskite-type oxide and the tungsten bronze-type oxide are included, and the perovskite-type oxide includes sodium, potassium and lithium, so the Curie temperature can be increased to 150° C. or over, and the operating temperature range can be extended, and the relative dielectric constant $\in r$, the electromechanical coupling factor kr and the amount of generated displacement can be increased. Further, sintering can be easily carried out.

Therefore, availability of the piezoelectric ceramic and the piezoelectric device including no lead or a smaller content of lead can be increased. In other words, a smaller amount of lead is volatilized during sintering, and the risk of emitting lead into environment even after the piezoelectric ceramic and the piezoelectric device are distributed in a market and then are disposed is lower, so the piezoelectric ceramic and the piezoelectric device being superior in the point of ultra-low emission, environmental friendliness and ecology can be utilized.

More specifically, when the content of potassium in the first element is within a range of 10 mol % to 90 mol % inclusive, more preferably within a range of 20 mol % to 75 mol % inclusive, still more preferably within a range of 30 mol % to 60 mol % inclusive, still more preferably within a range of 33 mol % to 57 mol % inclusive, and still more preferably within a range of 38 mol % to 55 mol % inclusive, superior piezoelectric properties can be obtained, and sintering can be more easily carried out.

Moreover, when the content of lithium in the first element is within a range of 20 mol % or less, more preferably within a range of 2 mol % to 20 mol % inclusive, and still more preferably within a range of 5 mol % to 10 mol % inclusive, or when the composition ratio of the first element to the second element (the first element/the second element) is within a range of 0.95 to 1.05 inclusive at molar ratio, the relative dielectric constant $\in r$, the electromechanical coupling factor kr and the amount of generated displacement can be increased.

Further, when silver is included as the first element, the amount of generated displacement can be increased, and sintering can be easily carried out. More specifically, when the content of silver in the first element is within a range of 5 mol % or less, the amount of generated displacement can be further increased.

In addition, when the component of the tungsten bronze-type oxide in the composition is within a range of 5.3 mol % or less, more preferably within a range of 0.2 mol % to 2.6 mol % inclusive, and still more preferably within a range of 0.5 mol % to 1.0 mol % inclusive, the electromechanical coupling factor kr and the amount of generated displacement can be further increased.

Further, when the tungsten bronze-type oxide includes the third element including at least one kind selected from the group consisting of elements of Group 2 in the long form of the periodic table of the elements, the fourth element including niobium or a fourth element including niobium and tantalum, and oxygen, and specifically the third element includes at least one kind selected from the group consisting of magnesium, calcium, strontium and barium which are elements of Group 2 in the long form of the periodic table of the elements, superior piezoelectric properties can be obtained.

Moreover, when the total content of tantalum in the second element and the fourth element is within a range of 50 mol % or less, more preferably within a range of 3 mol % to 30 mol % inclusive, and still more preferably within a range of 6 mol % to 20 mol % inclusive, the Curie temperature can be increased to 150° or over, that is, to such an extent that there is no problem in practical use, and the electromechanical coupling factor kr and the amount of generated displacement can be further increased.

Further, when as the sub-component, an oxide including at least one kind selected from the group consisting of elements of Groups 4 through 11 in the long form of the periodic table of the elements, element of Group 3 in the long form of the periodic table of the elements and elements of Group 12 in the long form of the periodic table of the elements is included within a range of 0.01 wt % to 1 wt % relative to the main component in total by each element group, sinterability can be improved, and the piezoelectric properties can be further improved. Specifically, when an oxide including manganese is included, a higher effect can be obtained, and when an oxide including at least one kind selected from the group consisting of iron, cobalt, nickel and zinc is included in addition to manganese, a higher effect can be obtained.

SECOND EMBODIMENT

A piezoelectric ceramic according to a second embodiment of the invention has the same structure as the piezoelectric ceramic according to the first embodiment, except that as the perovskite-type oxide, a first perovskite-type oxide and a second perovskite-type oxide are included. In the piezoelectric ceramic, the first perovskite-type oxide, the second perovskite-type oxide and the tungsten bronze-type oxide may form a solid solution, or may not perfectly form a solid solution.

The first perovskite-type oxide includes a first element including sodium and potassium, a second element including niobium or a second element including niobium and tantalum, and oxygen. The first element preferably further includes lithium, and may further include silver. The second element preferably further includes tantalum. It is because in such a case, superior piezoelectric properties can be obtained with no lead or a smaller content of lead. Moreover, it is because the Curie temperature can be increased, and the operating temperature range can be extended. The first perovskite-type oxide is represented by, for example, Chemical Formula 4.

In Chemical Formula 4, the values of x, y, z and w are within a range of $0<x<1$, $0 \leq y<1$, $0 \leq z<1$ and $0 \leq w<1$, respectively. When the first perovskite-type oxide is a stoichiometric composition, p is 1, but the first perovskite-type oxide may deviate from the stoichiometric composition. The composition of oxygen is stoichiometrically determined, and it may deviate from the stoichiometric composition.

Preferable contents of potassium and lithium in the first element, a preferable range of the composition ratio of the first element to the second element (the first element/the second element), and a preferable total content of tantalum in the second element and the fourth element are equivalent to those in the first embodiment.

The second perovskite-type oxide includes at least an element of Group 2 in the long form of the periodic table of the elements and titanium. As the element of Group 2 in the long form of the periodic table of the elements, at least one kind selected from the group consisting of magnesium, calcium, strontium and barium is preferable, because in such a case, superior piezoelectric properties can be obtained. The second perovskite-type oxide is represented by, for example, Chemical Formula 5.

In Chemical Formula 5, Q represents the element of Group 2 in the long form of the periodic table of the elements. A composition ratio of the element of Group 2 in the long form of the periodic table of the elements, titanium and oxygen is stoichiometrically determined, and it may deviate from the stoichiometric composition.

A composition ratio of the first perovskite-type oxide, the second perovskite-type oxide and the tungsten bronze-type oxide is preferably within a range represented by Chemical Formula 6 at molar ratio. In other words, the content of the second perovskite-type oxide in the composition is preferably within a range of larger than 0 mol % and less than 10 mol %. It is because when the second perovskite-type oxide is included, the relative dielectric constant ∈r and the amount of generated displacement can be increased, but when the content of the second perovskite-type oxide is too large, it is difficult to sinter. The content of the tungsten bronze-type oxide is preferably within a range of larger than 0 mol % and equal to 5.3 mol % or less, more preferably within a range of 0.2 mol % to 2.6 mol % inclusive, and still more preferably within a range of 0.5 mol % to 1.0 mol % inclusive as in the case of the first embodiment.

In Chemical Formula 6, A1 represents the first perovskite-type oxide, A2 represents the second perovskite-type oxide, and B represents the tungsten bronze-type oxide. Further, the values of m and n are within a range of $0<m<0.1$ and $0<n \leq 0.053$, respectively.

For example, the piezoelectric ceramic is preferably used as a material of the piezoelectric device as in the case of the first embodiment.

For example, the piezoelectric ceramic and the piezoelectric device having such a structure can be manufactured as follows.

Figure 2:
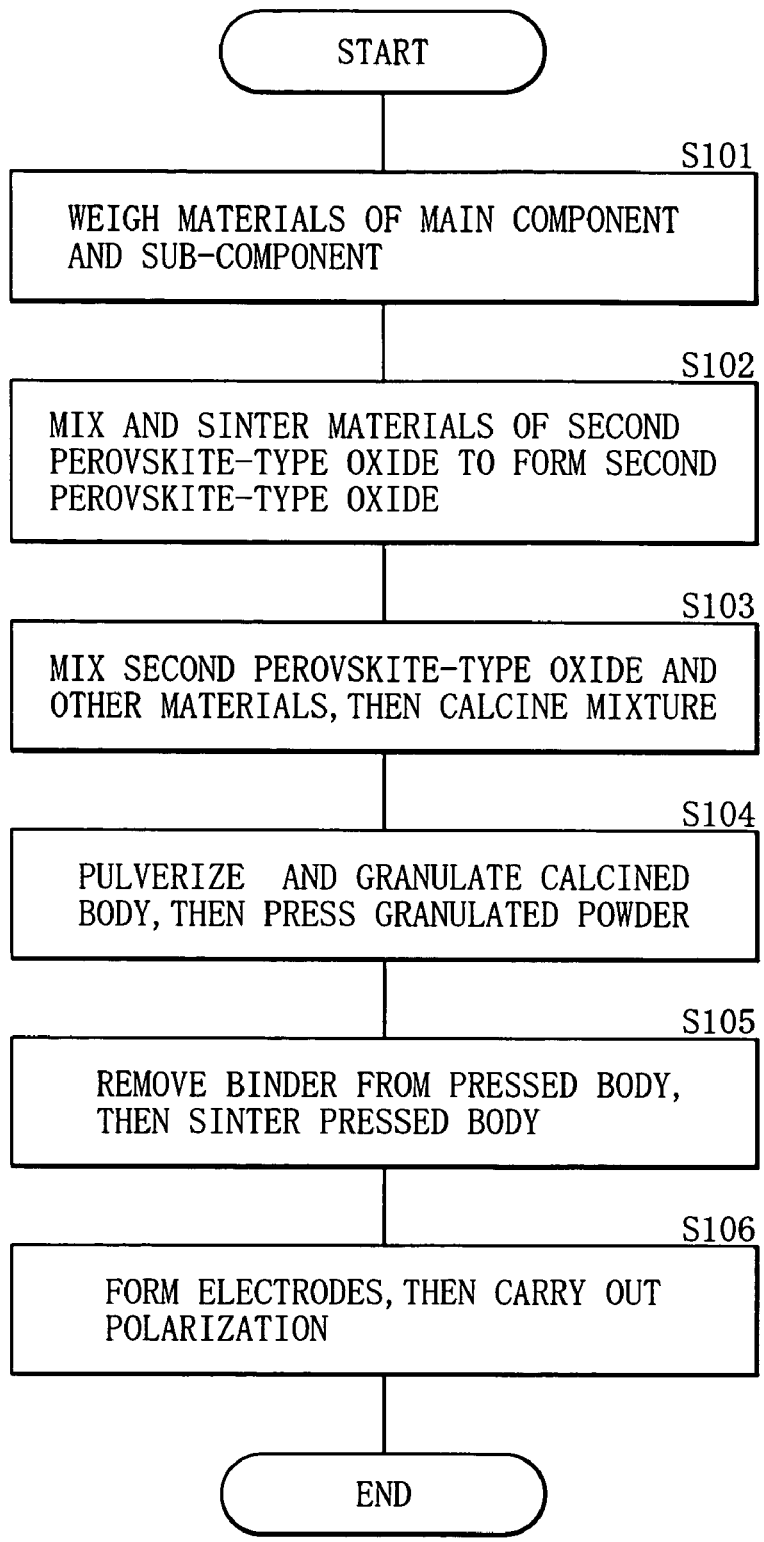
FIG. 2 is a flow chart showing a method of manufacturing a piezoelectric ceramic and a piezoelectric device according to a second embodiment of the invention.

FIG. 2 shows a flow chart of a method of manufacturing the piezoelectric ceramic. At first, as materials of elements of the main component, for example, oxide powders including sodium, potassium, lithium, silver, niobium, tantalum, the element of Group 2 in the long form of the periodic table of the elements and titanium are prepared as required. Moreover, as materials of elements of the sub-component, for example, an oxide powder including at least one kind selected from the group consisting of elements of Groups 4 through 11 in the long form of the periodic table of the elements, elements of Group 3 in the long form of the periodic table of the elements and elements of Group 12 in the long form of the periodic table of the elements is prepared as required. As the materials of the main component and the sub-component, carbonate or oxalate which becomes oxide through sintering may be used instead of oxide. Next, after these materials are sufficiently dried, the materials are weighed so that the final composition is within the above-described range (step S101).

Next, for example, after the materials of the second perovskite-type oxide are mixed in an organic solvent or water by a ball mill or the like, the materials are dried, and sintered at 1000° C. to 1200° C. for 2 to 4 hours so as to form the second perovskite-type oxide (step S102).

After the second perovskite-type oxide is formed, the second perovskite-type oxide, the materials of the first perovskite-type oxide, the materials of the tungsten bronze-type oxide, and the materials of the sub-component are sufficiently mixed in an organic solvent or water by a ball mill or the like. After that, the mixture is dried, and is pressed, and then is calcined at 750° C. to 1100° C. for 1 to 4 hours (step S103). The reason why the materials of the other main component are mixed after forming the second perovskite-type oxide is that when the materials of the second perovskite-type oxide and the materials of the first perovskite-type oxide are mixed and then are sintered, the materials of the second perovskite-type oxide react with the first perovskite-type oxide, thereby the second perovskite-type oxide cannot be formed.

After calcining, for example, the calcined body is sufficiently pulverized in an organic solvent or water by a ball mill or the like, and is dried again, then a binder is added to the calcined body to granulate the body. After granulating, the granulated powder is pressed by the use of a uniaxial press, a cold isostatic press (CIP) or the like (step S104).

After pressing, for example, the pressed body is heated to remove the binder, and then is further sintered at 950° C. to 1350° C. for 2 to 4 hours (step S105). After sintering, the obtained sintered body is processed as required to form the piezoelectric substrate 1, and then the electrode 2 and 3 are disposed on the piezoelectric substrate 1. Then, an electric field is applied to the piezoelectric substrate 1 in heated silicon oil to carry out polarization (step S106). Thereby, the piezoelectric ceramic and the piezoelectric device according to the embodiment can be obtained.

Thus, in the embodiment, the first perovskite-type oxide including sodium, potassium and niobium, the second perovskite-type oxide including an element of Group 2 in the long form of the periodic table of the elements and titanium, and the tungsten bronze-type oxide are included, and the content of the second perovskite-type oxide in the main component is within a range of less than 10 mol %, so the Curie temperature can be increased to 150° C. or over, and the operating temperature range can be extended, and the relative dielectric constant $\in$r, the electromechanical coupling factor kr and the amount of generated displacement can be increased. Moreover, sintering can be easily carried out.

Therefore, as in the case of the first embodiment, availability of the piezoelectric ceramic and the piezoelectric device including no lead or a smaller content of lead can be increased. In other words, a smaller amount of lead is volatilized during sintering, and the risk of emitting lead into environment even after the piezoelectric ceramic and the piezoelectric device are distributed in a market and then are disposed is lower, so the piezoelectric ceramic and the piezoelectric device being superior in the point of ultra-low emission, environmental friendliness and ecology can be utilized.

More specifically, as in the case of the first embodiment, when the content of potassium in the first element, the content of lithium in the first element, the content of silver in the first element, the composition ratio of the first element to the second element, the content of the tungsten bronze-type oxide in the composition, the composition of the tungsten bronze-type oxide, and the total content of tantalum in the second element and the fourth element are within the above-described range, or when the same sub-component as that in the first embodiment is included, the piezoelectric properties can be further improved.

Moreover, after synthesizing the second perovskite-type oxide, the second perovskite-type oxide, the materials of the elements of the first perovskite-type oxide, and the materials of the elements of the tungsten bronze-type oxide are mixed, and then the mixture is calcined and sintered, so the piezoelectric ceramic according to the embodiment can be easily obtained, and the piezoelectric ceramic according to the embodiment can be formed.

Next, specific examples of the invention will be described below.

EXAMPLES 1-1 THROUGH 1-5

A piezoelectric ceramic comprising a composition represented by Chemical Formula 7 including a perovskite-type oxide and a tungsten bronze-type oxide as a main component was used to form the piezoelectric device shown in FIG. 1. Examples 1-1 through 1-5 will be described referring to FIG. 1, and like components are denoted by like numerals shown in FIG. 1.

At first, as materials of the main component, a sodium carbonate ($Na_2CO_3$) powder, a potassium carbonate ($K_2CO_3$) powder, a lithium carbonate ($Li_2CO_3$) powder, a barium carbonate ($BaCO_3$) powder and a niobium oxide ($Nb_2O_5$) powder were prepared. Moreover, as a material of the sub-component, a manganese carbonate ($MnCO_3$) powder was prepared. Next, after the materials of the main component and the sub-component were sufficiently dried, and weighed, they were mixed in water by a ball mill for 5 hours, and then were dried so as to obtain a mixture powder.

At that time, the mixed ratios of the mixture powders of Examples 1-1 through 1-5 were adjusted so that the content of the tungsten bronze-type oxide in the composition of the main component, that is, the value of n in Chemical Formula 7 varied as shown in Table 1. Moreover, the content of manganese oxide, which was the sub-component, relative to the main component was 0.31 wt % on a basis of MnO. Further, carbonates among the materials of the main component were converted into oxides formed by dissociating $CO_2$ from the carbonates, and as the content of the sub-component, a mixed amount of the manganese carbonate powder, which was the material of the sub-component, relative to the total mass of the converted materials of the main component was adjusted to be 0.5 wt %.

Next, the mixture powder was pressed, and then was calcined at 850° C. to 1000° C. for 2 hours. After calcining, the pressed body was pulverized in water by the ball mill, and was dried again. Then, polyvinyl alcohol was added to the pulverized body to granulate. After granulating, the granulated powder was pressed by a uniaxial press with a pressure of approximately 40 MPa so as to form a cylindrical shape with a diameter of 17 mm, and then was isostatically pressed with a pressure of approximately 400 MPa.

After pressing, the pressed body was heated at 650° C. for 4 hours to remove the binder, and then the pressed body was sintered at 950° C. to 1350° C. for 4 hours. After that, the sintered body was formed into a disk shape with a thickness of 0.6 mm through a slicing process and a lapping process so as to form the piezoelectric substrate 1. Then, a silver paste was printed on both sides of the piezoelectric substrate 1, and was baked at 650° C. so as to form the electrodes 2 and 3. After forming the electrodes 2 and 3, an electric field of 3 kV/mm to 10 kV/mm was applied to the piezoelectric substrate 1 in silicon oil of 30° C. to 250° C. for 1 to 30 minutes to carry out polarization. Thereby, the piezoelectric devices using the piezoelectric ceramics of Examples 1-1 through 1-5 were obtained.

Figure 3:
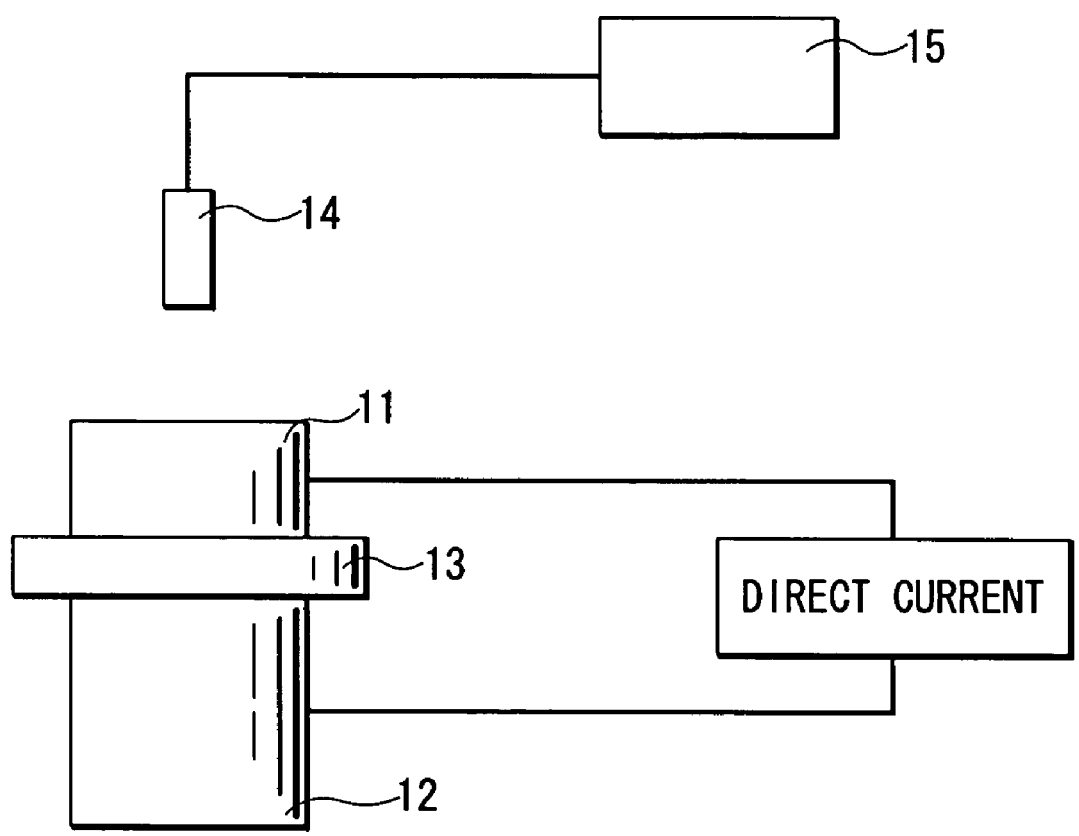
FIG. 3 is a block diagram of a displacement measuring device used for measuring an amount of generated displacement in examples of the invention.

After the obtained piezoelectric devices of Examples 1-1 through 1-5 were left alone for 24 hours, as the piezoelectric properties, the relative dielectric constant $\in$r, the electromechanical coupling factor kr, and the amount of generated displacement when an electric field of 3 kV/mm was applied were measured. The relative dielectric constant $\in$r and the electromechanical coupling factor kr were measured by an impedance analyzer (Hewlett-Packard's HP4194A), and a frequency when measuring the relative dielectric constant $\in$r was 1 kHz. The amount of generated displacement was measured by a displacement measuring device using eddy currents as shown in FIG. 3. In the displacement measuring device, a test sample 13 was sandwiched between a pair of electrodes 11 and 12, and the displacement of the test sample 13 when a direct current was applied was detected by a displacement sensor 14, and then the amount of generated displacement was determined by a displacement detecting device 15. These results are shown in Table 1. The amount of generated displacement shown in Table 1 was determined by dividing the measured value by the thickness of the test sample and then multiplying by 100 (the measured value/the thickness of the test sample×100).

As Comparative Example 1-1 relative to Examples, a piezoelectric device was formed as in the case of Examples 1-1 through 1-5, except that the tungsten bronze-type oxide was not included, that is, the value of n in Chemical Formula 7 was 0. The content of the sub-component was the same as that in Example 1-2. The relative dielectric constant ∈r, the electromechanical coupling factor kr and the amount of generated displacement when an electric field of 3 kV/mm was applied in the piezoelectric device of Comparative Example 1-1 were measured as in the case of Examples. These results are also shown in Table 1.

As shown in Table 1, Examples 1-1 through 1-5 could obtain a higher value of the relative dielectric constant ∈r, the electromechanical coupling factor kr or the amount of generated displacement than Comparative Example 1-1, and Examples 1-1 through 1-4 could obtain higher values of the relative dielectric constant ∈r, the electromechanical coupling factor kr and the amount of generated displacement than Comparative Example 1-1. Moreover, there was a tendency that as the value of n in Chemical Formula 7 increased, that is, as the content of the tungsten bronze-type oxide increased, the relative dielectric constant ∈r increased, and the electromechanical coupling factor kr and the amount of generated displacement increased to the maximum values, then decreased.

In other words, it was found out that when the perovskite-type oxide and the tungsten bronze-type oxide were included, the piezoelectric properties could be improved. Moreover, it was found out that when the content of the tungsten bronze-type oxide in the composition was within a range of 5.3 mol % or less, preferably within a range of 0.2 mol % to 2.6 mol % inclusive, and more preferably within a range of 0.5 mol % to 1.0 mol % inclusive, the amount of generated displacement could be further increased.

EXAMPLES 2-1 THROUGH 2-8

The piezoelectric devices of Examples 2-1 through 2-8 were formed as in the case of Example 1-2, except that a composition shown in Chemical Formula 8 was included as the main component. At that time, in Examples 2-1 through 2-8, the content of potassium in the first element, that is, the value of x in Chemical Formula 8 varied as shown in Table 2. Example 2-4 was equivalent to Example 1-2. The content of the tungsten bronze-type oxide, that is, the value of n in Chemical Formula 8 was 0.005 as in the case of Example 1-2, and the content of the sub-component relative to the main component was 0.31 wt % as in the case of Example 1-2. Further, as Comparative Examples 2-1 through 2-3 relative to Examples, the piezoelectric devices were formed as in the case of Examples except that the tungsten bronze-type oxide was not included. Comparative Example 2-1 corresponds to Example 2-1, and Comparative Example 2-2 corresponds to Example 2-4, and Comparative Example 2-3 corresponds to Example 2-8.

The relative dielectric constant ∈r, the electromechanical coupling factor kr and the amount of generated displacement when an electric field of 3 kV/mm was applied in the piezoelectric devices of Examples 2-1 through 2-8 and Comparative Examples 2-1 through 2-3 were measured as in the case of Example 1-2. The results are shown in Table 2.

As shown in Table 2, as in the case of Example 1-2, Example 2-1 through 2-8 could obtain higher values of the relative dielectric constant ∈r, the electromechanical coupling factor kr and the amount of generated displacement than corresponding Comparative Examples. Moreover, there was a tendency that as the value of x in Chemical Formula 8 increased, that is, as the content of potassium increased, the relative dielectric constant ∈r, the electromechanical coupling factor kr and the amount of generated displacement increased to the maximum values, then decreased. In other words, it was found out that when the content of potassium in the first element was within a range of 10 mol % to 90 mol % inclusive, preferably within a range of 20 mol % to 75 mol % inclusive, more preferably within a range of 30 mol % to 60 mol % inclusive, still more preferably within a range of 33 mol % to 57 mol % inclusive, and still more preferably within a range of 38 mol % to 55 mol % inclusive, the piezoelectric properties could be improved, and the amount of generated displacement could be increased.

EXAMPLES 3-1 THROUGH 3-4

The piezoelectric devices of Examples 3-1 through 3-4 were formed as in the case of Example 1-2, except that a composition shown in Chemical Formula 9 was included as the main component. At that time, in Examples 3-1 through 3-4, the contents of potassium and lithium in the first element, that is, the values of x and y in Chemical Formula 9 varied as shown in Table 3. Example 3-2 was equivalent to Example 1-2. Moreover, as in the case of Example 1-2, the content of the tungsten bronze-type oxide, that is, the value of n in Chemical Formula 9 was 0.005, and the content of the sub-component relative to the main component was 0.31 wt %. Further, as Comparative Examples 3-1 through 3-3 relative to Examples, the piezoelectric devices were formed as in the case of Examples, except that the tungsten bronze-type oxide was not included. Comparative Example 3-1 corresponds to Example 3-2, and Comparative Example 3-2 corresponds to Example 3-3, and Comparative Example 3-3 corresponds to Example 3-4.

The relative dielectric constant ∈r, the electromechanical coupling factor kr and the amount of generated displacement when an electric field of 3 kV/mm was applied in the piezoelectric devices of Examples 3-1 through 3-4 and Comparative Examples 3-1 through 3-3 were measured as in the case of Example 1-2. The results are shown in Table 3.

As shown in Table 3, as in the case of Example 1-2, Examples 3-1 through 3-4 could obtain higher values of the relative dielectric constant ∈r, the electromechanical coupling factor kr and the amount of generated displacement than Comparative Examples. Moreover, there was a tendency that as the value of y in Chemical Formula 9 increased, that is, as the content of lithium increased, the relative dielectric constant ∈r, the electromechanical coupling factor kr and the amount of generated displacement increased to the maximum values, then decreased. In other words, it was found out that when the content of lithium in the first element was within a range of 20 mol % or less, preferably within a range of 2 mol % to 20 mol % inclusive, and more preferably within a range of 5 mol % to 10 mol % inclusive, the piezoelectric properties could be improved, and the amount of generated displacement could be increased.

EXAMPLES 4-1 THROUGH 4-7

The piezoelectric devices of Examples 4-1 through 4-7 were formed as in the case of Example 1-2, except that a composition shown in Chemical Formula 10 was included as the main component. At that time, the contents of tantalum in the second element and the fourth element, that is, the values of w and v in Chemical Formula 10 varied in Examples 4-1 through 4-7 as shown in Table 4. As a material of tantalum, a tantalum oxide ($Ta_2O_5$) powder was used. Example 4-1 was equivalent to Example 1-2. Moreover, as in the case of Example 1-2, the content of the tungsten bronze-type oxide, that is, the value of n in Chemical Formula 10 was 0.005, and the content of the sub-component relative to the main component was 0.31 wt %. The relative dielectric constant ∈r, the electromechanical coupling factor kr and the amount of generated displacement when an electric field of 3 kV/mm was applied in the piezoelectric devices of Examples 4-1 through 4-7 were measured as in the case of Example 1-2. The results are shown in Table 4. Further, the Curie temperature in the piezoelectric ceramics of Examples 4-1 through 4-7 was measured. The results are also shown in Table 4.

As shown in Table 4, as in the case of Example 1-2, Example 4-1 through 4-7 could obtain higher values of the relative dielectric constant ∈r, the electromechanical coupling factor kr and the amount of generated displacement. Moreover, In Examples 4-2 through 4-7 in which tantalum was included in the second element and the fourth element, a higher amount of generated displacement could be obtained, compared to Example 4-1 in which no tantalum was included. Further, there was a tendency that as the values of w and v in Chemical Formula 10 increased, that is, as the total content of tantalum in the second element and the fourth element increased, the relative dielectric constant ∈r increased, and the electromechanical coupling factor kr and the amount of generated displacement increased to the maximum values, then decreased.

In addition, in Examples, a higher Curie temperature could be obtained. There was a tendency that the Curie temperature decreased with an increase in the total content of tantalum in the second element and the fourth element. However, it was found out that when the total content of tantalum in the second element and the fourth element was within a range of 50 mol % or less, a Curie temperature of 150° C. or over which was such a level that there is no problem in practical use could be obtained.

In Examples, the case where the contents of tantalum in the second element and the fourth element, that is, the values of w and v in Chemical Formula 10 were the same was shown. However, even if the values of w and v were different from each other, the same results could be obtained.

In other words, it was found out that when the second element and the fourth element included tantalum, and the total content of tantalum in the second element and the fourth element was within a range of 50 mol % or less, preferably within a range of 3 mol % to 30 mol % inclusive, and more preferably within a range of 6 mol % to 20 mol % inclusive, while maintaining a high Curie temperature, the amount of generated displacement could be further increased.

EXAMPLES 5-1 THROUGH 5-4

The piezoelectric devices of Examples 5-1 through 5-4 were formed as in the case of Example 1-2, except that a composition shown in Chemical Formula 11 was included as the main component. At that time, the composition ratio of the first element to the second element, that is, the value of p in Chemical Formula 11 varied in Examples 5-1 through 5-4 as shown in Table 5. Example 5-2 was equivalent to Example 1-2. Moreover, as in the case of Example 1-2, the content of the tungsten bronze-type oxide, that is, the value of n in Chemical Formula 11 was 0.005, and the content of the sub-component was 0.31 wt %. The relative dielectric constant ∈r, the electromechanical coupling factor kr and the amount of generated displacement when an electric field of 3 kV/mm was applied in the piezoelectric devices of Examples of 5-1 through 5-4 were measured as in the case of Example 1-2. The results are shown in Table 5.

As shown in Table 5, in Examples 5-1 through 5-4, as in the case of Example 1-2, higher values of the relative dielectric constant ∈r, the electromechanical coupling factor kr and the amount of generated displacement could be obtained. Moreover, there was a tendency that as the value of p in Chemical Formula 11 increased, that is, as the composition ratio of the first element to the second element increased, the relative dielectric constant ∈r, the electromechanical coupling factor kr and the amount of generated displacement increased to the maximum values, then decreased. In other words, it was found out that when the composition ratio of the first element to the second element was within a range of 0.95 to 1.05 inclusive, the piezoelectric properties could be further improved, and the amount of generated displacement could be further increased.

EXAMPLES 6-1 THROUGH 6-3

The piezoelectric devices of Examples 6-1 through 6-3 were formed as in the case of Example 1-2, except that a composition shown in Chemical Formula 12 was included as the main component. At that time, the composition of the third element, that is, M in Chemical Formula 12 varied in Examples 6-1 through 6-3 as shown in Table 6, and as a material of strontium, a strontium carbonate ($SrCO_3$) powder was used, and as a material of calcium, a calcium carbonate ($CaCO_3$) powder was used. Moreover, as in the case of Example 1-2, the content of the tungsten bronze-type oxide, that is, the value of n in Chemical Formula 12 was 0.005, and the content of the sub-component was 0.31 wt %. The relative dielectric constant ∈r, the electromechanical coupling factor kr and the amount of generated displacement when an electric field of 3 kV/mm was applied in the piezoelectric devices of Examples 6-1 through 6-3 were measured as in the case of Example 1-2. The results are shown in Table 6 together with the results of Example 1-2 and Comparative Example 1-1.

As shown in Table 6, as in the case of Example 1-2, Examples 6-1 through 6-3 could obtain higher values of the relative dielectric constant ∈r, the electromechanical coupling factor kr and the amount of generated displacement than Comparative Example 1-1. In other words, it was found out that even if another element of Group 2 in the long form of the periodic table of the elements was included in the third element, superior piezoelectric properties could be obtained.

EXAMPLES 7-1 THROUGH 7-10

The piezoelectric devices of Examples 7-1 through 7-10 were formed as in the case of Example 1-2, except that a composition shown in Chemical Formula 13 was included as the main component, and oxide shown in Table 7 was included as the sub-component. The composition of the main component shown in Chemical Formula 13 was equivalent to that in Example 4-4, and as the first sub-component, manganese oxide was used in common. In other words, Example 7-1 in which the second sub-component was not included was equivalent to Example 4-4. Moreover, as the second sub-component, iron oxide, cobalt oxide, nickel oxide or zinc oxide was used in Examples 7-2 through 7-10. The contents of the first sub-component and the second sub-component relative to the main component were calculated on a basis of chemical formulas shown in Table 7. Further, as a material of iron, a ferric oxide ($Fe_2O_3$) powder was used, and as a material of cobalt, a cobalt oxide ($Co_3O_4$) powder was used, and as a material of nickel, a nickel oxide (NiO) powder was used, and as a material of zinc, a zinc oxide (ZnO) powder was used, and as a material of tantalum, a tantalum oxide ($Ta_2O_5$) powder was used.

The relative dielectric constant $\in r$, the electromechanical coupling factor kr and the amount of generated displacement when an electric field of 3 kV/mm was applied in the piezoelectric devices of Examples 7-1 through 7-10 were measured as in the case of Example 1-2. The results are shown in Table 7.

As shown in Table 7, Examples 7-2 through 7-10 in which the second sub-component was included could obtain higher values of the electromechanical coupling factor kr and the amount of generated displacement than Example 7-1 in which the second sub-component was not included. In other words, it was found out that when an oxide including at least one kind selected from the group consisting of iron, cobalt, nickel and zinc was included as the sub-component in addition to manganese, the piezoelectric properties could be further improved, and the amount of generated displacement could be increased.

EXAMPLES 8-1 THROUGH 8-4

The piezoelectric devices of Examples 8-1 through 8-4 were formed as in the case of Example 1-2, except that a composition shown in Chemical Formula 14 was included as the main component. At that time, the contents of potassium and silver in the first element, that is, the values of x and z in Chemical Formula 14 varied in Examples 8-1 through 8-4 as shown in Table 8. As a material of silver, a silver oxide ($Ag_2O$) powder was used. The content of the tungsten bronze-type oxide, that is, the value of n in Chemical Formula 14 was 0.005, and the content of the sub-component relative to the main component was 0.31 wt %. Moreover, as Comparative Examples 8-1 through 8-4 relative to Examples, the piezoelectric devices were formed as in the case of Examples, except that the tungsten bronze-type oxide was not included. Comparative Example 8-1 corresponds to all Examples, and Comparative Example 8-2 corresponds to Example 8-1, and Comparative Example 8-3 corresponds to Example 8-2, and Comparative Example 8-4 corresponds to Example 8-3.

The relative dielectric constant $\in r$, the electromechanical coupling factor kr and the amount of generated displacement when an electric field of 3 kV/mm was applied in the piezoelectric devices of Examples 8-1 through 8-4 and Comparative Examples 8-1 through 8-4 were measured as in the case of Example 1-2. The results are shown in Table 8.

As shown in Table 8, Examples 8-1 through 8-4 could obtain higher values of the relative dielectric constant $\in r$, the electromechanical coupling factor kr and the amount of generated displacement than corresponding Comparative Examples. In other words, it was found out that even in the case where silver was included as the first element, when the tungsten bronze-type oxide was added, the piezoelectric properties could be improved.

Moreover, there was a tendency that as the value of z in Chemical Formula 14 increased, that is, as the content of silver increased, the relative dielectric constant $\in r$, the electromechanical coupling factor kr and the amount of generated displacement decreased. In other words, it was found out that the content of silver in the first element was more preferably within a range of 5 mol % or less.

EXAMPLES 9-1 THROUGH 9-4

The piezoelectric devices of Examples 9-1 through 9-4 were formed as in the case of Example 8-1, except that a composition shown in Chemical Formula 15 was included as the main component, and oxide shown in Table 9 was included as the sub-component. The composition of the main component shown in Chemical Formula 15 was equivalent to that in Example 8-1, and as the first sub-component, manganese oxide was used in common. Moreover, as the second sub-component, iron oxide, cobalt oxide, nickel oxide or zinc oxide was used in Examples 9-1 through 9-4. The contents of the first sub-component and the second sub-component relative to the main component were calculated on a basis of chemical formulas shown in Table 9, and as materials of the sub-components, materials shown in Table 9 were used.

The relative dielectric constant $\in r$, the electromechanical coupling factor kr and the amount of generated displacement when an electric field of 3 kV/mm was applied in the piezoelectric devices of Examples 9-1 through 9-4 were measured as in the case of Example 8-1. The results are shown in Table 9 together with the results of Example 8-1.

As shown in Table 9, Examples 9-1 through 9-4 in which the second sub-component was included could obtain higher values of the electromechanical coupling factor kr and the amount of generated displacement than Example 8-1 in which the second sub-component was not included. In other words, it was found out that when an oxide including at least one kind selected from the group consisting of iron, cobalt, nickel and zinc was included as the sub-component in addition to manganese, the piezoelectric properties could be further improved, and the amount of generated displacement could be increased.

EXAMPLES 10-1 THROUGH 10-3

A piezoelectric ceramic comprising a composition shown in Chemical Formula 16 as the main component was used to form the piezoelectric device shown in FIG. 1 through the steps shown in FIG. 2. Examples 10-1 through 10-3 will be described referring to FIGS. 1 and 2, and like components are denoted by like numerals shown in FIG. 1.

At first, as materials of the main component, a sodium carbonate ($Na_2CO_3$) powder, a potassium carbonate ($K_2CO_3$) powder, a lithium carbonate ($Li_2CO_3$) powder, a niobium oxide ($Nb_2O_5$) powder, a barium carbonate ($BaCO_3$) powder and titanium oxide ($TiO_2$) were prepared. Moreover, as a material of the sub-component, a manganese carbonate ($MnCO_3$) powder was prepared. Next, after the materials of the main component and the sub-component were sufficiently dried, they were weighed so that as the main component, a composition shown in Chemical Formula 16 and Table 10 was formed, and the content of manganese carbonate which was the sub-component was 0.31 wt % (refer to step S101 in FIG. 2).

Example 10-1 was equivalent to Example 1-2 in which the second perovskite-type oxide was not included, and in Examples 10-2 and 10-3, the second perovskite-type oxide was included in addition to the first perovskite-type oxide and the tungsten bronze-type oxide. Moreover, carbonates among the materials of the main component were converted into oxides formed by releasing $CO_2$ from the carbonates, and as the content of the sub-component, a mixed amount of the manganese carbonate powder, which was the material of the sub-component, relative to the total mass of the converted materials of the main component was adjusted to be 0.5 wt %.

Next, after the barium carbonate powder and titanium oxide were mixed in water by the ball mill, and were dried, the mixture was sintered at 1100° C. for 2 hours so as to form barium titanate which was the second perovskite-type oxide (refer to step S102 in FIG. 2).

After forming barium titanate, barium titanate, other materials of the main component, and the material of the sub-component were mixed in water by the ball mill, and were dried. Then, the mixture was pressed, and was calcined at 850° C. to 1000° C. for 2 hours (refer to step S103 in FIG. 2). After calcining, the calcined body was pulverized in water by the ball mill, and was dried again. Then, polyvinyl alcohol was added to the pulverized body to granulate. After granulating, the granulated powder was pressed by a uniaxial press with a pressure of approximately 40 MPa so as to form a cylindrical shape with a diameter of 17 mm, and then was isostatically pressed with a pressure of approximately 400 MPa (refer to step S104 in FIG. 2).

After pressing, the pressed body was heated at 650° C. for 4 hours to remove the binder, and then the pressed body was sintered at 950° C. to 1350° C. for 4 hours (refer to step S105 in FIG. 2). After that, the sintered body was formed into a disk shape with a thickness of 0.6 mm through a slicing process and a lapping process so as to form the piezoelectric substrate 1. Then, a silver paste was printed on both sides of the piezoelectric substrate 1, and was baked at 650° C. so as to form the electrodes 2 and 3. After forming the electrodes 2 and 3, an electric field of 3 kV/mm to 10 kV/mm was applied to the piezoelectric substrate 1 in silicon oil of 30° C. to 250° C. for 1 to 30 minutes to carry out polarization (refer to step S106 in FIG. 2). Thereby, the piezoelectric devices of Examples 10-1 through 10-3 were obtained.

As Comparative Example 10-1 relative to Examples, the piezoelectric device was formed as in the case of Examples, except that the content of barium titanate in the main component was 10 mol %, that is, the value of m in Chemical Formula 16 was 0.1.

The relative dielectric constant $\in r$, the electromechanical coupling factor kr and the amount of generated displacement when an electric field of 3 kV/mm was applied in the piezoelectric devices of Examples 10-1 through 10-3 and Comparative Example 10-1 were measured as in the case of Example 1-2. Moreover, the Curie temperature Tc was measured by a thermal analyzer. The results are shown in Table 10.

As shown in Table 10, Examples 10-2 and 10-3 could obtain higher values of the relative dielectric constant $\in r$, and the amount of generated displacement than Example 10-1 in which barium titanate was not included. Moreover, there was a tendency that as the value of m in Chemical Formula 16 increased, that is, as the content of barium titanate increased, the relative dielectric constant $\in r$ and the amount of generated displacement increased. Further, in Comparative Example 10-1 in which the content of barium titanate was 10 mol %, sintering could not be carried out, so the properties could not be measured. In Examples 10-2 and 10-3, a decline in the Curie temperature Tc was observed, compared to Example 10-1 in which barium titanate was not included. However, a declined amount was extremely small, so there is no problem in practical use.

In other words, it was found out that when less than 10 mol % of the second perovskite-type oxide was included in the main component in addition to the first perovskite type oxide and the tungsten bronze-type oxide, the amount of generated displacement could be further increased.

EXAMPLES 11-1 THROUGH 11-13

The piezoelectric devices of Examples 11-1 though 11-13 were formed as in the case of Examples 10-1 through 10-3, except that a composition shown in Chemical Formula 17 was included as the main component. At that time, the composition of the first element (the values of x and y in Chemical Formula 17) and the content of barium titanate which was the second perovskite-type oxide (the value of m in Chemical Formula 17) varied in Examples 11-1 through 11-13 as shown in Table 11. Further, the content of the sub-component was equivalent to that in Examples 10-1 through 10-3.

The relative dielectric constant $\in r$, the electromechanical coupling factor kr and the amount of generated displacement when an electric field of 3 kV/mm was applied in the piezoelectric devices of Examples 11-1 through 11-13 were measured as in the case of Example 1-2. The results are shown in Table 11.

As shown in Table 11, as in the case of Examples 10-2 and 10-3, Examples 11-2, 11-4, 11-5, 11-7, 11-9, 11-11 and 11-13 could obtain higher values of the relative dielectric constant $\in r$ and the amount of generated displacement than Examples in which barium titanate was not included. Moreover, there was a tendency that as the value of x in Chemical Formula 17 increased, that is, as the content of potassium increased, the relative dielectric constant $\in r$, the electromechanical coupling factor kr and the amount of generated displacement increased to the maximum values, then decreased. In other words, it was found out that when the content of potassium in the first element was within a range of 10 mol % to 90 mol % inclusive, the piezoelectric properties could be improved, and the amount of generated displacement could be increased.

Moreover, there was a tendency that when lithium was included as the first element, the relative dielectric constant $\in r$, the electromechanical coupling factor kr and the amount of generated displacement further increased. In other words, it was found out that when 20 mol % or less of lithium was included in the first element, the piezoelectric properties could be improved, and the amount of generated displacement could be increased.

EXAMPLES 12-1 THROUGH 12-3

The piezoelectric devices of Examples 12-1 through 12-3 were formed as in the case of Examples 10-1 through 10-3, except that a composition shown in Chemical Formula 18 was included as the main component. At that time, the content of tantalum (the values of w and v in Chemical Formula 18) and the content of barium titanate which was the second perovskite-type oxide (the value of m in Chemical Formula 18) varied in Examples 12-1 through 12-3 as shown in Table 12. The content of the sub-component was equivalent to that in Examples 10-1 through 10-3, and a tantalum oxide ($Ta_2O_5$) powder was used as a material of tantalum.

The relative dielectric constant $\in r$, the electromechanical coupling factor kr and the amount of generated displacement when an electric field of 3 kV/mm was applied in the piezoelectric devices of Examples 12-1 through 12-3 were measured as in the case of Example 1-2, and the Curie temperate Tc was measured by a thermal analyzer. The results are shown in Table 12 together with the results of Examples 10-1 through 10-3.

As shown in Table 12, as in the case of Examples 10-2 and 10-3, Examples 12-2 and 12-3 could obtain higher values of the relative dielectric constant ∈r and the amount of generated displacement than Example 12-1 in which barium titanate was not included. Moreover, in Examples 12-2 and 12-3 in which tantalum was included in the second element and the fourth element, a higher amount of generated displacement could be obtained, compared to Examples 10-2 and 10-3 in which tantalum was not included. However, in Examples 12-2 and 12-3, a larger decline in Curie temperature Tc was observed, compared to Examples 10-2 and 10-3.

In Examples, the case where the contents of tantalum in the second element and the fourth element, that is, the values of w and v in Chemical Formula 18 were the same was shown. However, even if the values of w and v were different from each other, the same results could be obtained.

In other words, it was found out that when the second element and the fourth element included tantalum, and the total content of tantalum in the second element and the fourth element was within a range of 50 mol % or less, while maintaining the Curie temperature Tc to a certain extent or higher, the amount of generated displacement could be increased.

EXAMPLES 13-1 THROUGH 13-4

The piezoelectric devices of Examples 13-1 through 13-4 were formed as in the case of Example 10-3, except that a composition shown in Chemical Formula 19 was included as the main component, and oxide shown in Table 13 was included as the sub-component. The composition of the main component shown in Chemical Formula 19 was equivalent to that in Example 10-3, and as the first sub-component, manganese oxide was used in common. Moreover, as the second sub-component, iron oxide, cobalt oxide, nickel oxide or zinc oxide was used in Examples 13-1 through 13-4. The contents of the first sub-component and the second component relative to the main component were calculated on a basis of chemical formulas shown in Table 13, and as the materials of the sub-components, materials shown in Table 13 were used.

The relative dielectric constant ∈r, the electromechanical coupling factor kr and the amount of generated displacement when an electric field of 3 kV/mm was applied in the piezoelectric devices of Examples 13-1 through 13-4 were measured as in the case of Example 10-3. The results are shown in Table 13 together with the results of Example 10-3.

As shown in Table 13, in Example 13-1 through 13-4 in which the second sub-component was included, higher values of the electromechanical coupling factor kr and the amount of generated displacement could be obtained, compared to Example 10-3 in which the second sub-component was not included. In other words, it was found out that when an oxide including at least one kind selected from the group consisting of iron, cobalt, nickel and zinc was included as the sub-component in addition to manganese, the piezoelectric properties could be further improved, and the amount of generated displacement could be increased.

In the above examples, the composition including the perovskite-type oxide and the tungsten bronze-type oxide is described in detail referring to some examples. However, as long as the composition is within a range described in the above embodiments, even if any other composition is used, the same effects can be obtained.

Although the present invention is described referring to the embodiments and the examples, the invention is not limited to the above embodiments and the above examples, and is variously modified. For example, in the above embodiments and the above examples, the case where the composition including the perovskite-type oxide and the tungsten bronze-type oxide is comprised is described; however, any other component may be further included in the composition in addition to the perovskite-type oxide and the tungsten bronze-type oxide.

Moreover, in the above embodiments and the above examples, the case where the perovskite-type oxide including the first element, the second element and oxygen is included or the case where the first perovskite-type oxide including the first element, the second element and oxygen, and the second perovskite-type oxide including an element of Group 2 in the long form of the periodic table of the elements and titanium are included is described; however, any other perovskite-type oxide may be further included.

Further, in the above embodiments and the above examples, the case where the composition of the main component includes the first element including sodium, potassium and, if necessary, lithium and silver, the second element including niobium or a second element including niobium and tantalum, the third element including at least one kind selected from elements of Group 2 in the long form of the periodic table of the elements, and the fourth element including niobium or a fourth element including niobium and tantalum is described; however, each of the first element, the second element, the third element and the fourth element may further include any other element.

In addition, in the above embodiments and the above examples, the case where the second perovskite-type oxide includes at least an element of Group 2 in the long form of the periodic table of the elements and titanium is described; however, any other element may be further included.

Moreover, in the above embodiments and the above examples, the case where the sub-component is included in addition to the main component is described. However, as long as the composition of the main component is included, the invention can be widely applied to the case where the sub-component is not included. Further, the invention can be applied to the case where any other sub-component is included in a like manner.

In addition, in the above embodiments, although the piezoelectric device with a single-layer structure is described, the invention can be applied to a piezoelectric device with any other structure such as a multilayer structure or the like in a like manner. Further, although a vibration device such as an actuator, a sound component and a sensor are taken as examples of the piezoelectric device, the invention can be applied to any other piezoelectric device.

As described above, in a first piezoelectric ceramic according to the invention, the perovskite-type oxide and the tungsten bronze-type oxide are comprised, and the perovskite-type oxide includes sodium, potassium and lithium, or in a second piezoelectric ceramic according to the invention, the first perovskite-type oxide including sodium, potassium and niobium, the second perovskite-type oxide including an element of Group 2 in the long form of the periodic table of the elements and titanium, and the tungsten bronze-type oxide are comprised, and the content of the second perovskite-type oxide in the main component is less than 10 mol %, so the Curie temperature can be increased to 150° C. or over, thereby the operating temperature range can be extended, and the relative dielectric constant ∈r, the electromechanical coupling factor kr and the amount of generated displacement can be increased. Moreover, sintering can be easily carried out.

Therefore, availability of the piezoelectric ceramic and the piezoelectric device including no lead or a smaller content of lead can be increased. In other words, a smaller amount of lead is volatilized during sintering, and the risk of emitting lead into environment even after the piezoelectric ceramic and the piezoelectric device are distributed in a market and then are disposed is lower, so the piezoelectric ceramic and the piezoelectric device being superior in the point of ultra-low emission, environmental friendliness and ecology can be utilized.

More specifically, in the piezoelectric ceramic according to an aspect of the invention, the content of potassium in the first element is within a range of 10 mol % to 90 mol % inclusive, so superior piezoelectric properties can be obtained, and sintering can be more easily carried out.

In the piezoelectric ceramic according to another aspect of the invention, the content of lithium in the first element is 20 mol % or less, or the composition ratio of the first element to the second element (the first element/the second element) is within a range of 0.95 to 1.05 inclusive at molar ratio, so the relative dielectric constant ∈r, the electromechanical coupling factor kr and the amount of generated displacement can be further increased.

In the piezoelectric ceramic according to still another aspect of the invention, the content of the tungsten bronze-type oxide in the composition is 5.3 mol % or less, so the electromechanical coupling factor kr and the amount of generated displacement can be further increased.

In the piezoelectric ceramic according to a further aspect of the invention, the tungsten bronze-type oxide includes the third element including at least one kind selected from elements of Group 2 in the long form of the periodic table of the elements, the fourth element including niobium or a fourth element including niobium and tantalum, and oxygen, so superior piezoelectric properties can be obtained.

In the piezoelectric ceramic according to a still further aspect of the invention, the total content of tantalum in the second element and the fourth element is 50 mol % or less, so the Curie temperature can be increased to 150° C. or over, that is, to such an extent that there is no problem in practical use, and the electromechanical coupling factor kr and the amount of generated displacement can be further increased.

Moreover, in the piezoelectric ceramic according to a still aspect of the invention, as the sub-component, an oxide including at least one kind selected from the group consisting of elements of Groups 4 through 11 in the long form of the periodic table of the elements, elements of Group 3 in the long form of the periodic table of the elements and elements of Group 12 in the long form of the periodic table of the elements is included within a range of 0.01 wt % to 1 wt % inclusive relative to the main component in total by each element group, so the sinterability can be improved, and the piezoelectric properties can be further improved.

Further, in the piezoelectric ceramic according to a still aspect of the invention, as the sub-component, an oxide including manganese is included, or as the sub-component, an oxide including at least one kind selected from the group consisting of iron, cobalt, nickel and is zinc included in addition to manganese, so the piezoelectric properties can be further improved.

In a method of manufacturing the piezoelectric ceramic according to the invention, a mixture including the materials of the elements of the first perovskite-type oxide, the second perovskite-type oxide, and elements of the tungsten bronze-type oxide is calcined, so the second piezoelectric ceramic according to the invention can be easily obtained, and the second piezoelectric ceramic according to the invention can be formed.

Obviously many modifications and variations of the present invention are possible in the light of the above teachings. It is therefore to be understood that within the scope of the appended claims the invention may be practiced otherwise than as specifically described.

TABLE 1

| | COMPOSITION OF MAIN COMPONENT | | CONTENT OF MnO RELATIVE TO MAIN COMPONENT (wt %) | RELATIVE DIELECTRIC CONSTANT ∈r | ELECTROMECHANICAL COUPLING FACTOR kr (%) | AMOUNT OF GENERATED DISPLACEMENT (%) |
|---|---|---|---|---|---|---|
| | THIRD ELEMENT M | n (mol) | | | | |
| EXAMPLE1-1 | Ba | 0.002 | 0.31 | 470 | 41.9 | 0.075 |
| EXAMPLE1-2 | Ba | 0.005 | 0.31 | 535 | 43.1 | 0.083 |
| EXAMPLE1-3 | Ba | 0.01 | 0.31 | 572 | 40.8 | 0.081 |
| EXAMPLE1-4 | Ba | 0.026 | 0.31 | 682 | 36.5 | 0.079 |
| EXAMPLE1-5 | Ba | 0.053 | 0.31 | 949 | 28.2 | 0.072 |
| COMPARATIVE EXAMPLE1-1 | — | 0 | 0.31 | 375 | 33.9 | 0.053 |

TABLE 2

| | COMPOSITION OF MAIN COMPONENT | | | CONTENT OF MnO RELATIVE TO MAIN COMPONENT (wt %) | RELATIVE DIELECTRIC CONSTANT ∈r | ELECTROMECHANICAL COUPLING FACTOR kr (%) | AMOUNT OF GENERATED DISPLACEMENT (%) |
|---|---|---|---|---|---|---|---|
| | THIRD ELEMENT M | x (mol) | n (mol) | | | | |
| EXAMPLE2-1 | Ba | 0.20 | 0.005 | 0.31 | 348 | 30.5 | 0.048 |
| EXAMPLE2-2 | Ba | 0.30 | 0.005 | 0.31 | 425 | 37.6 | 0.065 |

TABLE 2-continued

| | COMPOSITION OF MAIN COMPONENT | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|
| | THIRD ELEMENT M | x (mol) | n (mol) | | | | |
| EXAMPLE2-3 | Ba | 0.33 | 0.005 | 0.31 | 503 | 40.1 | 0.076 |
| EXAMPLE2-4 | Ba | 0.38 | 0.005 | 0.31 | 535 | 43.1 | 0.083 |
| EXAMPLE2-5 | Ba | 0.55 | 0.005 | 0.31 | 543 | 41.4 | 0.081 |
| EXAMPLE2-6 | Ba | 0.57 | 0.005 | 0.31 | 546 | 40.2 | 0.078 |
| EXAMPLE2-7 | Ba | 0.60 | 0.005 | 0.31 | 525 | 38.6 | 0.074 |
| EXAMPLE2-8 | Ba | 0.75 | 0.005 | 0.31 | 374 | 32.2 | 0.053 |
| COMPARATIVE EXAMPLE2-1 | — | 0.20 | 0 | 0.31 | 220 | 24.1 | 0.029 |
| COMPARATIVE EXAMPLE2-2 | — | 0.38 | 0 | 0.31 | 375 | 33.9 | 0.053 |
| COMPARATIVE EXAMPLE2-3 | — | 0.75 | 0 | 0.31 | 232 | 25.5 | 0.031 |

TABLE 3

| | COMPOSITION OF MAIN COMPONENT | | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|---|
| | THIRD ELEMENT M | x (mol) | y (mol) | n (mol) | | | | |
| EXAMPLE3-1 | Ba | 0.39 | 0.02 | 0.005 | 0.31 | 408 | 35.5 | 0.060 |
| EXAMPLE3-2 | Ba | 0.38 | 0.05 | 0.005 | 0.31 | 535 | 43.1 | 0.083 |
| EXAMPLE3-3 | Ba | 0.36 | 0.1 | 0.005 | 0.31 | 763 | 34.3 | 0.080 |
| EXAMPLE3-4 | Ba | 0.32 | 0.2 | 0.005 | 0.31 | 541 | 28.4 | 0.056 |
| COMPARATIVE EXAMPLE3-1 | — | 0.38 | 0.05 | 0 | 0.31 | 375 | 33.9 | 0.053 |
| COMPARATIVE EXAMPLE3-2 | — | 0.36 | 0.10 | 0 | 0.31 | 602 | 25.9 | 0.052 |
| COMPARATIVE EXAMPLE3-3 | — | 0.32 | 0.20 | 0 | 0.31 | 390 | 18.1 | 0.029 |

TABLE 4

| | COMPOSITION OF MAIN COMPONENT | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) | CURIE TEMPERATURE (° C.) |
|---|---|---|---|---|---|---|---|---|
| | THIRD ELEMENT M | w, v (mol) | n (mol) | | | | | |
| EXAMPLE4-1 | Ba | 0 | 0.005 | 0.31 | 535 | 43.1 | 0.083 | 462 |
| EXAMPLE4-2 | Ba | 0.03 | 0.005 | 0.31 | 706 | 45.6 | 0.101 | 445 |
| EXAMPLE4-3 | Ba | 0.06 | 0.005 | 0.31 | 916 | 46.9 | 0.118 | 429 |
| EXAMPLE4-4 | Ba | 0.1 | 0.005 | 0.31 | 965 | 45.7 | 0.118 | 405 |
| EXAMPLE4-5 | Ba | 0.2 | 0.005 | 0.31 | 998 | 43.1 | 0.115 | 351 |
| EXAMPLE4-6 | Ba | 0.3 | 0.005 | 0.31 | 1006 | 40.7 | 0.108 | 293 |
| EXAMPLE4-7 | Ba | 0.5 | 0.005 | 0.31 | 1030 | 33.4 | 0.09 | 158 |

TABLE 5

| | COMPOSITION OF MAIN COMPONENT | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|
| | THIRD ELEMENT M | p (mol) | n (mol) | | | | |
| EXAMPLE5-1 | Ba | 1.01 | 0.005 | 0.31 | 402 | 38.5 | 0.065 |
| EXAMPLE5-2 | Ba | 1.00 | 0.005 | 0.31 | 535 | 43.1 | 0.083 |

TABLE 5-continued

| | COMPOSITION OF MAIN COMPONENT | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|
| | THIRD ELEMENT M | p (mol) | n (mol) | | | | |
| EXAMPLE5-3 | Ba | 0.99 | 0.005 | 0.31 | 502 | 41.3 | 0.078 |
| EXAMPLE5-4 | Ba | 0.98 | 0.005 | 0.31 | 436 | 39.8 | 0.070 |

TABLE 6

| | COMPOSITION OF MAIN COMPONENT | | CONTENT OF MnO RELATIVE TO MAIN COMPONENT (wt %) | RELATIVE DIELECTRIC CONSTANT $\epsilon R$ | ELECTROMECHANICAL COUPLING FACTOR kr (%) | AMOUNT OF GENERATED DISPLACEMENT (%) |
|---|---|---|---|---|---|---|
| | THIRD ELEMENT M | n (mol) | | | | |
| EXAMPLE1-2 | Ba | 0.005 | 0.31 | 535 | 43.1 | 0.083 |
| EXAMPLE6-1 | $(Ba_{0.5}Sr_{0.3}Ca_{0.2})$ | 0.005 | 0.31 | 516 | 41.7 | 0.079 |
| EXAMPLE6-2 | $(Ba_{0.4}Sr_{0.4}Ca_{0.2})$ | 0.005 | 0.31 | 513 | 42.0 | 0.079 |
| EXAMPLE6-3 | $(Ba_{0.3}Sr_{0.5}Ca_{0.2})$ | 0.005 | 0.31 | 518 | 42.3 | 0.080 |
| COMPARATIVE EXAMPLE1-1 | — | 0 | 0.31 | 375 | 33.9 | 0.053 |

TABLE 7

| | FIRST SUB-COMPONENT | | SECOND SUB-COMPONENT | | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|
| | KIND | CONTENT RELATIVE TO MAIN COMPONENT (wt %) | KIND | CONTENT RELATIVE TO MAIN COMPONENT (wt %) | | | |
| EXAMPLE7-1 | MnO | 0.31 | — | 0 | 965 | 45.7 | 0.118 |
| EXAMPLE7-2 | MnO | 0.31 | $Fe_2O_3$ | 0.2 | 1015 | 47.5 | 0.126 |
| EXAMPLE7-3 | MnO | 0.31 | $Co_3O_4$ | 0.2 | 1015 | 48.2 | 0.126 |
| EXAMPLE7-4 | MnO | 0.31 | NiO | 0.2 | 962 | 47.3 | 0.124 |
| EXAMPLE7-5 | MnO | 0.31 | ZnO | 0.01 | 953 | 47.2 | 0.124 |
| EXAMPLE7-6 | MnO | 0.31 | ZnO | 0.05 | 948 | 49.0 | 0.131 |
| EXAMPLE7-7 | MnO | 0.31 | ZnO | 0.1 | 976 | 48.3 | 0.128 |
| EXAMPLE7-8 | MnO | 0.31 | ZnO | 0.2 | 1013 | 47.5 | 0.124 |
| EXAMPLE7-9 | MnO | 0.31 | ZnO | 0.5 | 1041 | 47.0 | 0.122 |
| EXAMPLE7-10 | MnO | 0.31 | ZnO | 1.0 | 1020 | 46.8 | 0.122 |

TABLE 8

| | COMPOSITION OF MAIN COMPONENT | | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|---|
| | THIRD ELEMENT M | x (mol) | z (mol) | n (mol) | | | | |
| EXAMPLE8-1 | Ba | 0.38 | 0.005 | 0.005 | 0.31 | 541 | 43.2 | 0.083 |
| EXAMPLE8-2 | Ba | 0.38 | 0.01 | 0.005 | 0.31 | 502 | 40.3 | 0.075 |
| EXAMPLE8-3 | Ba | 0.37 | 0.03 | 0.005 | 0.31 | 475 | 39.9 | 0.072 |
| EXAMPLE8-4 | Ba | 0.36 | 0.05 | 0.005 | 0.31 | 455 | 38.6 | 0.068 |
| COMPARATIVE EXAMPLE8-1 | — | 0.38 | 0 | 0 | 0.31 | 375 | 33.9 | 0.053 |
| COMPARATIVE EXAMPLE8-2 | — | 0.38 | 0.005 | 0 | 0.31 | 453 | 41.4 | 0.073 |
| COMPARATIVE EXAMPLE8-3 | — | 0.38 | 0.01 | 0 | 0.31 | 412 | 38.1 | 0.064 |
| COMPARATIVE EXAMPLE8-4 | — | 0.37 | 0.03 | 0 | 0.31 | 417 | 38.9 | 0.066 |

TABLE 9

| | FIRST SUB-COMPONENT | | SECOND SUB-COMPONENT | | | | |
|---|---|---|---|---|---|---|---|
| | KIND | CONTENT RELATIVE TO MAIN COMPONENT (wt %) | KIND | CONTENT RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
| EXAMPLE8-1 | MnO | 0.31 | — | 0 | 502 | 40.3 | 0.075 |
| EXAMPLE9-1 | MnO | 0.31 | $Fe_2O_3$ | 0.2 | 548 | 41.9 | 0.081 |
| EXAMPLE9-2 | MnO | 0.31 | $Co_3O_4$ | 0.2 | 548 | 42.4 | 0.082 |
| EXAMPLE9-3 | MnO | 0.31 | NiO | 0.2 | 499 | 41.7 | 0.079 |
| EXAMPLE9-4 | MnO | 0.31 | ZnO | 0.2 | 545 | 41.9 | 0.081 |

TABLE 10

| | COMPOSITION OF MAIN COMPONENT m(mol) | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) | CURIE TEMPERATURE Tc (° C.) |
|---|---|---|---|---|---|---|
| EXAMPLE10-1 | 0 | 0.31 | 535 | 43.1 | 0.083 | 462 |
| EXAMPLE10-2 | 0.005 | 0.31 | 724 | 39.7 | 0.089 | 460 |
| EXAMPLE10-3 | 0.01 | 0.31 | 855 | 41.4 | 0.101 | 459 |
| COMPARATIVE EXAMPLE10-1 | 0.1 | 0.31 | — | — | — | — |

TABLE 11

| | COMPOSITION OF MAIN COMPONENT | | | CONTENT OF MnO RELATIVE TO MAIN COMPONENT (wt %) | RELATIVE DIELECTRIC CONSTANT $\epsilon r$ | ELECTROMECHANICAL COUPLING FACTOR kr (%) | AMOUNT OF GENERATED DISPLACEMENT (%) |
|---|---|---|---|---|---|---|---|
| | x (mol) | y (mol) | m (mol) | | | | |
| EXAMPLE11-1 | 0.19 | 0.05 | 0 | 0.31 | 348 | 30.5 | 0.048 |
| EXAMPLE11-2 | 0.19 | 0.05 | 0.08 | 0.31 | 574 | 26.7 | 0.053 |
| EXAMPLE11-3 | 0.285 | 0.05 | 0 | 0.31 | 344 | 34.8 | 0.052 |
| EXAMPLE11-4 | 0.285 | 0.05 | 0.01 | 0.31 | 546 | 33.5 | 0.064 |
| EXAMPLE11-5 | 0.285 | 0.05 | 0.02 | 0.31 | 741 | 34.6 | 0.076 |
| EXAMPLE11-6 | 0.36 | 0.1 | 0 | 0.31 | 763 | 34.3 | 0.080 |
| EXAMPLE11-7 | 0.36 | 0.1 | 0.01 | 0.31 | 1144 | 32.5 | 0.089 |
| EXAMPLE11-8 | 0.75 | 0.05 | 0 | 0.31 | 374 | 32.2 | 0.053 |
| EXAMPLE11-9 | 0.75 | 0.05 | 0.03 | 0.31 | 511 | 29.7 | 0.057 |
| EXAMPLE11-10 | 0.6 | 0 | 0 | 0.31 | 270 | 42.8 | 0.058 |
| EXAMPLE11-11 | 0.6 | 0 | 0.01 | 0.31 | 444 | 39.2 | 0.067 |
| EXAMPLE11-12 | 0.8 | 0 | 0 | 0.31 | 239 | 29.2 | 0.040 |
| EXAMPLE11-13 | 0.8 | 0 | 0.08 | 0.31 | 490 | 28.3 | 0.045 |

TABLE 12

| | COMPOSITION OF MAIN COMPONENT | | CONTENT OF MnO RELATIVE TO MAIN COMPONENT (wt %) | RELATIVE DIELECTRIC CONSTANT $\epsilon r$ | ELECTRO-MECHANICAL COUPLING FACTOR kr (%) | AMOUNT OF GENERATED DISPLACEMENT (%) | CURIE TEMPERATURE Tc (° C.) |
|---|---|---|---|---|---|---|---|
| | w, v (mol) | m (mol) | | | | | |
| EXAMPLE10-1 | 0 | 0 | 0.31 | 535 | 43.1 | 0.083 | 462 |
| EXAMPLE10-2 | 0 | 0.005 | 0.31 | 724 | 39.7 | 0.089 | 460 |
| EXAMPLE10-3 | 0 | 0.01 | 0.31 | 855 | 41.4 | 0.101 | 459 |
| EXAMPLE12-1 | 0.05 | 0 | 0.31 | 883 | 42.0 | 0.101 | 434 |
| EXAMPLE12-2 | 0.05 | 0.005 | 0.31 | 977 | 42.7 | 0.108 | 430 |
| EXAMPLE12-3 | 0.05 | 0.01 | 0.31 | 938 | 41.9 | 0.104 | 428 |

TABLE 13

| | FIRST SUB-COMPONENT | | SECOND SUB-COMPONENT | | RELATIVE DIELECTRIC CONSTANT ∈r | ELECTROMECHANICAL COUPLING FACTOR kr (%) | AMOUNT OF GENERATED DISPLACEMENT (%) |
|---|---|---|---|---|---|---|---|
| | KIND | CONTENT RELATIVE TO MAIN COMPONENT (wt %) | KIND | CONTENT RELATIVE TO MAIN COMPONENT (wt %) | | | |
| EXAMPLE10-3 | MnO | 0.31 | — | 0 | 855 | 41.4 | 0.101 |
| EXAMPLE13-1 | MnO | 0.31 | $Fe_2O_3$ | 0.2 | 903 | 43 | 0.107 |
| EXAMPLE13-2 | MnO | 0.31 | $Co_3O_4$ | 0.2 | 904 | 43.8 | 0.109 |
| EXAMPLE13-3 | MnO | 0.31 | NiO | 0.2 | 853 | 42.7 | 0.105 |
| EXAMPLE13-4 | MnO | 0.31 | ZnO | 0.2 | 901 | 42.9 | 0.107 |

The invention claimed is:

1. A piezoelectric ceramic comprising:
a composition including perovskite-type oxide and tungsten bronze-type oxide,
wherein the perovskite-type oxide includes a first element including sodium (Na), potassium (K), and lithium (Li), a second element including niobium (Nb) or a second element including niobium and tantalum (Ta), and oxygen (O), and
the content of the tungsten bronze-type oxide in the composition is 5.3 mol % or less.

2. A piezoelectric ceramic according to claim 1, wherein as the first element, silver (Ag) is further included.

3. A piezoelectric ceramic according to claim 2, wherein the content of silver in the first element is within a range of 5 mol % or less.

4. A piezoelectric ceramic according to claim 1, wherein the content of potassium in the first element is within a range of 10 mol % to 90 mol % both inclusive.

5. A piezoelectric ceramic according to claim 1, wherein the content of lithium in the first element is 20 mol % or less.

6. A piezoelectric ceramic according to claim 1, wherein a composition ratio of the first element to the second element (the first element/the second element) in the perovskite-type oxide or the first perovskite-type oxide is within a range of 0.95 to 1.05 both inclusive at molar ratio.

7. A piezoelectric ceramic according to claim 1, wherein the tungsten bronze-type oxide includes:
a third element including at least one kind selected from elements of Group 2 in the long form of the periodic table of the elements,
a fourth element including niobium or a fourth element including niobium and tantalum, and
oxygen.

8. A piezoelectric ceramic according to claim 7, wherein the third element includes at least one kind selected from the group consisting of magnesium (Mg), calcium (Ca), strontium (Sr) and barium (Ba).

9. A piezoelectric ceramic according to claim 7, wherein the total content of tantalum in the second element and the fourth element is within a range of 0 mol % to 50 mol % both inclusive.

10. A piezoelectric ceramic according to claim 1, wherein the composition is considered as a main component, and as a sub-component, an oxide including at least one kind selected from the group consisting of elements of Groups 4 through 11 in the long form of the periodic table of the elements, elements of Group 3 in the long form of the periodic table of the elements and elements of Group 12 in the long form of the periodic table of the elements is included, and
the content of the oxide is within a range of 0.01 wt % to 1 wt % both inclusive relative to the main component in total of the oxide by each element group of Groups 4 through 11 in the long form of the periodic table of elements, elements group of Group 3 in the long form of the periodic table of the elements and element group of Group 12 in the long form of the periodic table.

11. A piezoelectric ceramic according to claim 10, wherein as the sub-component, an oxide including manganese (Mn) is included.

12. A piezoelectric ceramic according to claim 11, wherein as the sub-component, an oxide including at least one kind selected from the group consisting of iron (Fe), cobalt (Co), nickel (Ni) and zinc (Zn) is included in addition to an oxide including manganese.

13. A piezoelectric ceramic, comprising:
a composition including a first perovskite-type oxide, a second perovskite-type oxide and a tungsten bronze-type oxide,
wherein the first perovskite-type oxide includes a first element including sodium (Na) and potassium (K), a second element including niobium (Nb) or a second element including niobium and tantalum (Ta), and oxygen (O),
the second perovskite-type oxide includes an element of Group 2 in the long form of the periodic table of the elements and titanium (Ti), and
the content of the second perovskite-type oxide in the composition is less than 10 mol %.

14. A piezoelectric ceramic according to claim 13, wherein as the first element, lithium (Li) is further included.

15. A piezoelectric ceramic according to claim 14, wherein the content of lithium in the first element is 20 mol % or less.

16. A piezoelectric ceramic according to claim 13, wherein the content of potassium in the first element is within a range of 10 mol % to 90 mol % both inclusive.

17. A piezoelectric ceramic according to claim 13, wherein a composition ratio of the first element to the second element (the first element/the second element) in the perovskite-type oxide or the first perovskite-type oxide is within a range of 0.95 to 1.05 both inclusive at molar ratio.

18. A piezoelectric ceramic according to claim 13, wherein the content of the tungsten bronze-type oxide in the composition is 5.3 mol % or less.

19. A piezoelectric ceramic according to claim 13, wherein the tungsten bronze-type oxide includes:
- a third element including at least one kind selected from elements of Group 2 in the long form of the periodic table of the elements,
- a fourth element including niobium or a fourth element including niobium and tantalum, and
- oxygen.

20. A piezoelectric ceramic according to claim 19, wherein the third element includes at least one kind selected from the group consisting of magnesium (Mg), calcium (Ca), strontium (Sr) and barium (Ba).

21. A piezoelectric ceramic according to claim 19, wherein the total content of tantalum in the second element and the fourth element is within a range of 0 mol % to 50 mol % both inclusive.

22. A piezoelectric ceramic according to claim 13, wherein the composition is considered as a main component, and as a sub-component, an oxide including at least one kind selected from the group consisting of elements of Groups 4 through 11 in the long form of the periodic table of the elements, elements of Group 3 in the long form of the periodic table of the elements and elements of Group 12 in the long form of the periodic table of the elements is included, and
the content of the oxide is within a range of 0.01 wt % to 1 wt % both inclusive relative to the main component in total of the oxide by each element group of Groups 4 through 11 in the long form of the periodic table of elements, element group of Group 3 in the long form of the periodic table of elements and element group of Group 12 in the long form of the periodic table.

23. A piezoelectric ceramic according to claim 22, wherein as the sub-component, an oxide including manganese (Mn) is included.

24. A piezoelectric ceramic according to claim 23, wherein as the sub-component, an oxide including at least one kind selected from the group consisting of iron (Fe), cobalt (Co), nickel (Ni) and zinc (Zn) is included in addition to an oxide including manganese.

25. A method of manufacturing a piezoelectric ceramic, the piezoelectric ceramic comprising a first perovskite-type oxide including a first element including sodium (Na) and potassium (K), a second element including niobium (Nb) or a second element including niobium and tantalum (Ta), and oxygen, a second perovskite-type oxide including an element of Group 2 in the long form of the periodic table of the elements and titanium (Ti), and a tungsten bronze-type oxide, the method comprising the step of:
- calcining a mixture including elements of the first perovskite-type oxide, the second perovskite-type oxide and elements of the tungsten bronze-type oxide.

* * * * *

UNITED STATES PATENT AND TRADEMARK OFFICE
CERTIFICATE OF CORRECTION

| | |
|---|---|
| PATENT NO. | : 7,309,450 B2 |
| APPLICATION NO. | : 10/479576 |
| DATED | : December 18, 2007 |
| INVENTOR(S) | : Masaru Nanao et al. |

It is certified that error appears in the above-identified patent and that said Letters Patent is hereby corrected as shown below:

On the Title Page Item (54) Please correct the title "Piezoelectric Porcelain and Method for Preparation Thereof" to --Piezoelectric Ceramic and Method of Manufacturing the Same--.

Signed and Sealed this

Twenty-ninth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,309,450 B2  
APPLICATION NO. : 10/479576  
DATED : December 18, 2007  
INVENTOR(S) : Masaru Nanao et al.

Page 1 of 1

It is certified that error appears in the above-identified patent and that said Letters Patent is hereby corrected as shown below:

On the Title Page Item (54) and Column 1, lines 1 and 2 Please correct the title "Piezoelectric Porcelain and Method for Preparation Thereof" to --Piezoelectric Ceramic and Method of Manufacturing the Same--.

This certificate supersedes the Certificate of Correction issued April 29, 2008.

Signed and Sealed this

Twentieth Day of May, 2008

JON W. DUDAS  
*Director of the United States Patent and Trademark Office*